(12) United States Patent
Qing et al.

(10) Patent No.: US 9,542,878 B2
(45) Date of Patent: Jan. 10, 2017

(54) SHIFT REGISTER UNIT, DISPLAY PANEL AND DISPLAY APPARATUS

(71) Applicants: BOE TECHNOLOGY GROUP CO., LTD., Beijing (CN); CHENGDU BOE OPTOELECTRONICS TECHNOLOGY CO., LTD., Chengdu (CN)

(72) Inventors: Haigang Qing, Beijing (CN); Xiaojing Qi, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu (CN)

( * ) Notice: Subject to any disclaimer, the term of this patent is extended or adjusted under 35 U.S.C. 154(b) by 0 days.

(21) Appl. No.: 14/771,129

(22) PCT Filed: Mar. 6, 2015

(86) PCT No.: PCT/CN2015/073765
§ 371 (c)(1),
(2) Date: Aug. 27, 2015

(87) PCT Pub. No.: WO2016/065785
PCT Pub. Date: May 6, 2016

(65) Prior Publication Data
US 2016/0351112 A1    Dec. 1, 2016

(30) Foreign Application Priority Data
Oct. 29, 2014   (CN) .......................... 2014 1 0594095

(51) Int. Cl.
*G11C 19/00* (2006.01)
*G09G 3/20* (2006.01)
*G11C 19/28* (2006.01)

(52) U.S. Cl.
CPC ............. *G09G 3/2096* (2013.01); *G11C 19/28* (2013.01); *G09G 2310/0286* (2013.01);
(Continued)

(58) Field of Classification Search
CPC .... G09G 3/20; G09G 3/34; G09G 2300/0482; G09G 2300/0842; G09G 2300/0847; G09G 2300/0852; G09G 2300/0857; G09G 2300/0861; G09G 2300/0866; G09G 2310/08; G09G 3/3685; G09G 3/3688; G09G 3/3692; G09G 2310/0286; G09G 3/2096; G09G 2330/023; G09G 2330/028; G11C 19/28; G11C 19/00; H03K 23/54; H03K 5/15; H03K 23/00; G06F 5/01
See application file for complete search history.

(56) References Cited

U.S. PATENT DOCUMENTS

2009/0146716 A1\* 6/2009 Ide ....................... G11C 7/1072
  327/276
2014/0143292 A1\* 5/2014 Yasuda ................... G06F 7/588
  708/251

\* cited by examiner

*Primary Examiner* — Lun-Yi Lao
*Assistant Examiner* — Jarurat Suteerawongsa
(74) *Attorney, Agent, or Firm* — Harness, Dickey & Pierce, P.L.C.

(57) ABSTRACT

A shift register unit includes a latch circuit and a transmission circuit. The latch circuit is configured to process a clock signal received by its first clock signal end and a low level signal by a NOR operation to obtain a signal and output the obtained signal when a selection signal is of a high level; during a first time period where the selection signal is of a low level, process a signal outputted by the latch circuit when the selection signal is of a high level by a NOT operation, then process the resultant signal with a feedback signal by a NOR operation to obtain a signal and output the obtained signal; output a low level signal during a time (Continued)

period where the selection signal is of a low level other than the first time period. The transmission circuit is configured to output a signal related to the clock signal received by its first clock signal end when the signal outputted by the latch circuit is of a high level; and output a corresponding signal when the signal outputted by the latch circuit is of a low level.

20 Claims, 19 Drawing Sheets

(52) U.S. Cl.
CPC ... *G09G 2310/08* (2013.01); *G09G 2330/023* (2013.01); *G09G 2330/028* (2013.01)

-Prior Artns# SHIFT REGISTER UNIT, DISPLAY PANEL AND DISPLAY APPARATUS

CROSS REFERENCE OF RELATED APPLICATIONS

This application is the U.S. national phase of PCT Application No. PCT/CN2015/073765 filed on Mar. 6, 2015, which claims a priority of the Chinese Patent Application No. 201410594095.4 filed on Oct. 29, 2014, the disclosures of which are incorporated in their entirety by reference herein.

TECHNICAL FIELD

The present disclosure relates to a technical field of displaying, in particular to a shift register unit, a display panel and a display apparatus.

BACKGROUND

In a conventional Low Temperature Poly-Silicon (LTPS) shift register unit, D flip-flops consisted of inverters and transmission gates are adopted. In generally, the conventional LTPS shift register unit includes two D flip-flops. In the LTPS shift unit, an output signal is latched by the D flip-flop, and shift and transmission of the signal are controlled by a clock signal.

FIG. 1 illustrates a representative structure of the conventional LTPS shift register unit. As illustrated in FIG. 1, in the LTPS shift register unit, a first D flip-flop is consisted of a transmission gate TG1, a NAND gate Nand1, an inverter INV1 and a transmission gate TG2, and a second D flip-flop is consisted of a transmission gate TG3, a NAND gate Nand2, an inverter INV2 and a transmission gate TG4. When a clock signal CLK is of a low level and a reverse clock signal CLKB is of a high level so that the first D flip-flop is turned on, a signal outputted by a previous shift register unit enters into the first D flip-flop. At this time, the transmission gate TG3 at a front end of the second D flip-flop is in an OFF state, and thus the signal outputted by the NAND gate Nand1 cannot enter into the second D flip-flop. On the other hand, when the clock signal CLK is of a high level and the reverse clock signal CLKB is of a low level so that the transmission gate TG1 in the first D flip-flop is turned off, the state of the D flip-flop in a previous clock period is latched by the first D flip-flop. In other words, when the clock signal CLK is of a high level and the reverse clock signal CLKB is of a low level, the first D flip-flop latches the signal outputted by the first D flip-flop when the clock signal CLK is of the low level and the reverse clock signal CLKB is of the high level. At this time, the transmission gate TG3 in the second D flip-flop is turned on, and the signal outputted by the first D flip-flop enters into the second D flip-flop which then outputs this signal. Thus, a shift operation of the signal from a previous shift register unit to a next shift register unit is implemented. When the shift register unit operates, a reset signal RST is of a high level.

However, for the display apparatus, each shift register unit is used only once during a time period for displaying one frame of image. For example, in the display apparatus, if there are N rows of pixels and the time period for displaying one frame of image is T seconds, then one shift register unit may be used for merely T/N seconds during the time period for displaying one frame of the image. That is, during the time period for displaying one frame of image, each shift register unit is kept in an operation state for merely T/N seconds, but in a non-operation state for T−T/N seconds. In other words, during the time period of one frame, an operation period of each shift register unit is only T/N seconds, and a non-operation period thereof is T−T/N seconds.

In the conventional shift register unit, turning on and off of all the transmission gates are controlled by the clock signal CLK and the reverse clock signal CLKB. Even during a non-operation period, the transmission gates are still turned on and off by the clock signal CLK and the reverse clock signal CLKB. Each of the transmission gates is consisted of parallel connected complementary transistors. When the transmission gates are controlled to be turned on and off by the clock signal CLK and the reverse clock signal CLKB, the clock signal CLK and the reverse clock signal CLKB is required to be inputted to gate electrodes of the transistors. In each of the transistors, the gate electrode covers a gate insulation layer, which covers a substrate. Thus, a capacitor is formed between the gate electrode and the substrate, which may be called a gate capacitor. In this manner, the gate capacitor of the transistor will be charged by the signal inputted to the gate electrode of the transistor when the signal is of a high level, and will be discharged by the signal when the signal is of a low level. As a result, during the non-operation period, such charging and discharging of the circuit may cause meaningless power consumption. A contemporary display apparatus often includes hundreds or thousands stages of shift register units, and only one stage of the shit register unit circuit is operating at a same time, meanwhile the other shift register units are in the non-operation state. At this time, both the clock signal CLK and the reverse clock signal CLKB will be inputted to the transmission gates of the transfer register units which are in the non-operation state, which may cause meaningless but large power consumption.

It can be seen from above that, due to the fact that the transmission gates in the conventional shift register units are controlled to switch between being-turned-on and being-turned-off by the two complementary and reversed clock signals during the non-operation period, the gate capacitors of the transistors in the transmission gates are charged and discharged during the non-operation period, which causes meaningless but large power consumption.

SUMMARY (1) Technical Problems to be Solved

In embodiments of the present disclosure, it is provided a shift register unit, a display panel and a display apparatus to solve the following problem: in the conventional shift register unit, it is required two complementary and reverse clock signals to control the switching of the transmission gate between turning-on and turning-off, so that the gate capacitor of the transistor in the transmission gate is charged and discharged during the non-operation period of the shift register unit, which causes meaningless but large power consumption.

(2) Technical Solutions

For solving the above problem, in one aspect of the present disclosure, it is provided a shift register unit including a latch circuit and a transmission circuit; the latch circuit is configured to process a clock signal received by a first clock signal end of the shift register unit and a low level signal by a NOR operation to obtain a signal and output the obtained signal when a selection signal is of a high level, wherein the clock signal received by the first clock signal end is of a low level when the selection signal is of a high level; during a first time period where the selection signal is of a low level, process the signal outputted by the latch circuit when the selection signal is of a high level by NOT operation to obtain a signal, then process the resultant signal with a feedback signal by a NOR operation to obtain a signal, and output the obtained signal; output a low level signal during a time period where the selection signal is of a low level other than the first time period where the selection signal is of a first low level; and the transmission circuit is configured to output a signal related to the clock signal received by the first clock signal end when the signal outputted by the latch circuit is of a high level; and output a corresponding signal when the signal outputted by the latch circuit is of a low level;

wherein, the feedback signal is able to make the signal outputted by the latch circuit during the time period where the selection signal is of a high level and the signal outputted by the latch circuit during the first time period where the selection signal is of a low level be the same; the feedback signal is converted from being of a low level to being of a high level, at an end time point of the first time period where the selection signal is of a low level; and the first time period where the selection signal is of a low level is a time period from a time point when the selection signal is converted from being of a low level to being of a high level to a time point when a signal outputted by a next stage shift register unit with respect to the shift register unit jumps from being of a low level to being of a high level.

In another aspect of the present disclosure, it is provided a display panel including a plurality of stages of the shift register units according to the embodiment of the present disclosure.

In another aspect of the present disclosure, it is provided a display apparatus including the display panel according to the embodiment of the present disclosure.

(3) Advantageous Effects

The embodiments of the present disclosure at least implements the following advantageous effects: in the shift register unit, the display panel and the display apparatus according to the embodiment of the present disclosure, the latch circuit in the shift register unit is capable of processing the clock signal received by the first clock signal end and a low level signal by a NOR operation to obtain a signal of a high level and outputting the obtained signal when the selection signal is of a high level, and capable of maintaining a state of the latch circuit when the selection signal is of a high level during the first time period where the selection signal is of a low level. That is, the latch circuit may latch the state when the selection signal is of a high level, the state of the latch circuit may be changed by the feedback signal, and the signal outputted by the output circuit may be controlled by the signal outputted by the latch circuit. As a result, a shift registering function is implemented. In other words, in this embodiment of the present disclosure, the shift register unit is controlled by the selection signal to implement the shift registering function, so that it is avoided that the transmission gate in the shift register unit is controlled by the two complementary and reversed clock signals to implement the shift registering function. Thus, the meaningless power consumption of the shift register unit during a non-operation time period is reduced.

BRIEF DESCRIPTION OF THE DRAWINGS

In order to illustrate the technical solutions of the present disclosure or the related art in a clearer manner, the drawings desired for the embodiments will be described briefly hereinafter. Obviously, the following drawings merely relate to some embodiments of the present disclosure, and based on these drawings, a person skilled in the art may obtain the other drawings without any creative effort.

DETAILED DESCRIPTION

The present disclosure will be described hereinafter in conjunction with the drawings and embodiments. The following embodiments are for illustrative purposes only, but shall not be used to limit the scope of the present disclosure.

In order to make the objects, the technical solutions and the advantages of the present disclosure more apparent, some technical solutions of the present disclosure will be described hereinafter in a clear and complete manner in conjunction with the drawings and embodiments. Obviously, the following embodiments are merely a part of, rather than all of, the embodiments of the present disclosure, and based on these embodiments, a person skilled in the art may obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "a/an" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

In the shift register unit, the display panel and the display apparatus according to the embodiment of the present disclosure, the latch circuit in the shift register unit may latch the state of the circuit when a latch selection signal is of a high level, the state of the latch circuit is changed by the feedback signal, and the signal outputted by the transmission circuit is controlled by the signal outputted by the latch circuit. As a result, a shift registering function is implemented. In this manner, it is avoided that the transmission gate in the shift register unit is controlled by the two complementary and reversed clock signals to implement the shift registering function, and thus the meaningless power consumption of the shift register unit during the non-operation time period is reduced.

In the following, embodiments of the shift register unit, the display panel and the display apparatus will be explained with figures.

General Circuit Structure

Figure 1:
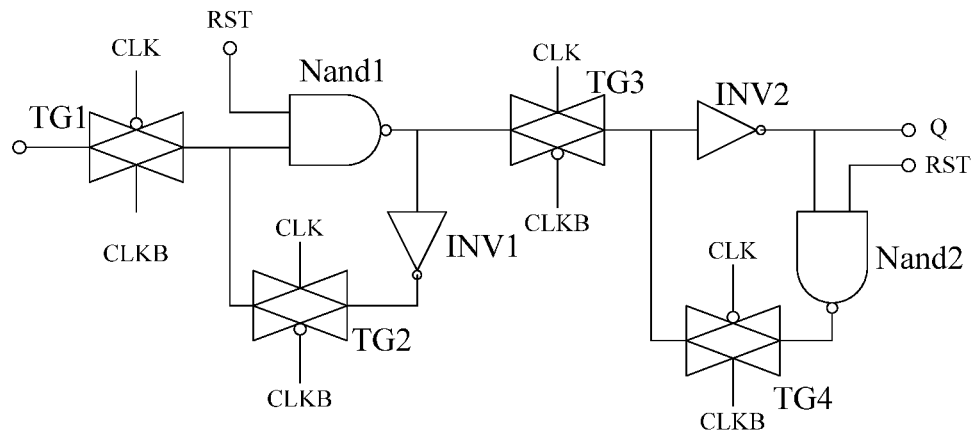
FIG. 1 is a schematic diagram for a structure of a conventional shift register unit.
Figure 2:
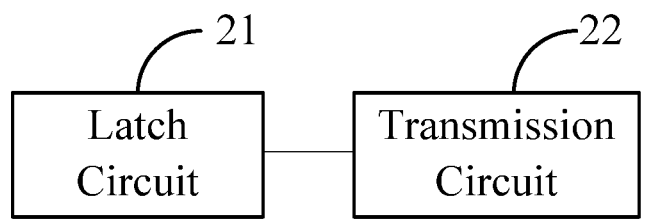
FIG. 2 is a block diagram for a structure of a shift register unit according to an embodiment of the present disclosure.

In the embodiment of the present disclosure, as illustrated in FIG. 2, the shift register unit includes a latch circuit 21 and a transmission circuit 22.

The latch circuit 21 processes a clock signal received by a first clock signal end of a shift register unit and a low level signal by a NOR operation to obtain a signal and output the obtained signal when a selection signal is of a high level. The clock signal received by the first clock signal end is of a low level when the selection signal is of a high level. Then, during a first time period where the selection signal is of a low level, the latch circuit 21 processes the signal outputted by the latch circuit 21 when the selection signal is of a high level by a NOT operation, then process the resultant signal with a feedback signal by a NOR operation to obtain a signal and output the obtained signal. Furthermore, the latch circuit 21 outputs a low level signal during a time period where the selection signal is of a low level other than the first time period where the selection signal is of a low level.

The transmission circuit 22 outputs a signal related to the clock signal received by the first clock signal end when the signal outputted by the latch circuit 21 is of a high level; and outputs a corresponding signal when the signal outputted by the latch circuit 21 is of a low level.

In particular, the feedback signal is able to make the signal outputted by the latch circuit during the time period where the selection signal is of a high level and the signal outputted by the latch circuit during the first time period where the selection signal is of a low level be the same; the feedback signal is converted from being of a low level to being of a high level, at an end time point of the first time period where the selection signal is of a low level; and the first time period where the selection signal is of a low level is a time period from a time point when the selection signal is converted from being of a low level to being of a high level to a time point when a signal outputted by a next stage shift register unit with respect to the shift register unit jumps from being of a low level to being of a high level.

Upon a forward scanning, a selection signal received by a k-th stage shift register unit may be the signal outputted by a (k−1)-th stage shift register unit. At this time, a next stage shift register unit to the k-th shift register unit is a (k+1)-th stage shift register unit. In contrast, upon a backward scanning, the selection signal received by the k-th stage shift register unit may be a signal outputted by the (k+1)-th stage shift register unit. At this time, a next stage shift register unit to the k-th shift register unit is the (k−1)-th stage shift register unit. During a time period where the selection signal is of a high level and a first time period where the selection signal is of a low level, the k-th stage shift register unit is in an operation state.

During the time period where the selection signal is of a high level, since the selection signal is of a high level and the signal received by the first clock signal end of the shift register unit is of a low level, the signal outputted by the latch circuit 21 is of a high level. Furthermore, during the first time period where the selection signal is of a low level, since the selection signal is of a low level and the signal received by the first clock signal end of the shift register unit is of a high level, the signal outputted by the latch circuit 21 is still of a high level. That is, during the first time period where the selection signal is of a low level, the latch circuit 21 may latch its state when the selection signal is of a high level. Moreover, during the first time period where the selection signal is of a low level, the latch circuit 21 processes a signal outputted by the latch circuit 21 when the selection signal is of a high level by a NOT operation, then process the resultant signal with a feedback signal by a NOR operation to obtain a signal, and output the obtained signal. Thus, once the feedback signal is of a high level, the signal outputted by the latch circuit 21 is of a low level. That is, when the selection signal is of a low level, the signal outputted by the latch circuit may be changed by the feedback signal, and thus the shift register unit may be changed from being in an operation state to be in a non-operation state. At an end time point of the first time period where the selection signal is of a low level, the feedback signal is changed from being of a low level to being of a high level. Thus, at the end time point of the first time period where the selection signal is of a low level, the signal outputted by the latch circuit is changed to be of a low level. That is, at the end time point of the first time period where the selection signal is of a low level, the shift register unit is changed from being in an operation state to be in a non-operation state.

When the signal outputted by the latch circuit 21 is of a high level, the transmission circuit 22 outputs a signal related to the clock signal received by the first clock signal end of the shift register unit. In particular, the transmission circuit 22 may outputs a signal, either identical to, or reverse to, the clock signal received by the first clock signal end of the shift register unit. As a result, the shift register unit implements the shift registering function. When the signal outputted by the latching circuit 21 is of a low level, the transmission circuit 22 outputs a corresponding signal. In particular, the output circuit 22 may output a high level signal or a low level signal, so that the shift register unit may enter the non-operation state.

That is, in this embodiment of the present disclosure, the shift register unit is configured to control, through the selection signal, the latch circuit to latch, during the first time period where the selection signal is of a low level, its state when the selection signal is of a high level, and control the transmission circuit based on the state of the latch circuit, so that the shift registering function may be implemented by the shift register unit. Furthermore, the state of the latch circuit may be changed based on the change of a level of the feedback signal when the selection signal is of a low level, so that the shift register unit may enter its non-operation state. In this manner, it is unnecessary to adopt two complementary signals to control the transmission gate so that the shift register unit implements the shift registering function and enters its non-operation state. As a result, the meaningless power consumption of the shift register unit during the non-operation time period is reduced.

First and Second Embodiments Regarding Latch Circuit

Figure 3:
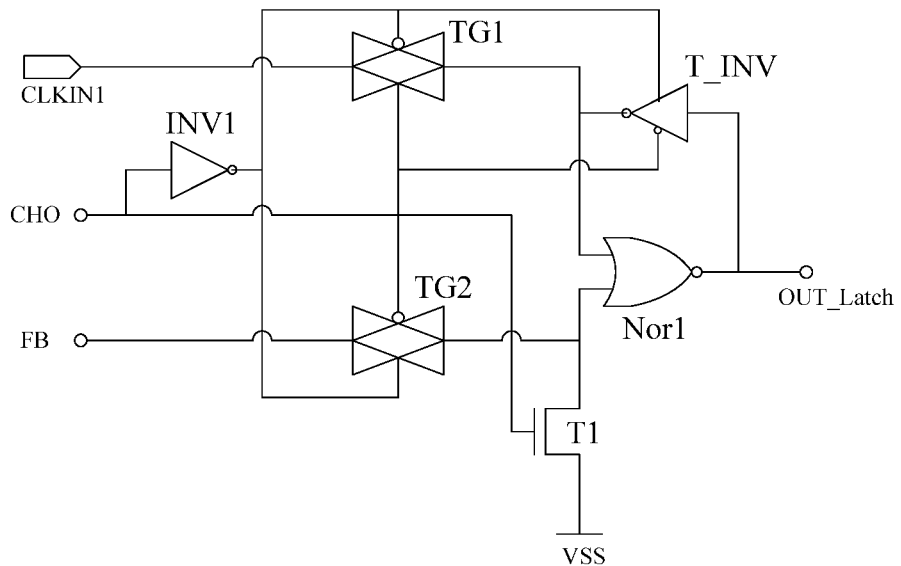
FIG. 3 is a first schematic diagram for a structure of a latch circuit in the shift register unit according to an embodiment of the present disclosure.

Alternatively, as illustrated in FIG. 3, the latch circuit includes a first inverter INV1, a ternary inverter T_INV, a first transmission gate TG1, a second transmission gate TG2, a first NOR gate Nor1 and a first transistor T1.

The first inverter INV1 receives the selection signal CHO, processes a selection signal CHO by a NOT operation to obtain a signal and outputs the obtained signal. If the selection signal CHO is of a high level, a signal outputted by the first inverter INV1 is of a low level. In contrast, if the selection signal CHO is of a low level, the signal outputted by the first inverter INV1 is of a high level.

A control end of the first transmission gate TG1 which is effective when inputted with a low level receives the signal outputted by the first inverter INV1, another control end of the first transmission gate TG1 which is effective when inputted with a high level receives the selection signal CHO, an input end of the first transmission gate TG1 is the first clock signal end CLKIN1 of the shift register unit, and the first transmission gate TG1 outputs the clock signal received by the input end of the first transmission gate TG1 when the first transmission gate TG1 is turned on. When the selection signal CHO is of a high level, the first transmission gate TG1 is turned on. In contrast, when the selection signal CHO is of a low level, the first transmission gate TG1 is turned off.

A control end of the second transmission gate TG2 which is effective when inputted with a low level receives the selection signal CHO, another control end of the second transmission gate TG2 which is effective when inputted with a high level receives the signal outputted by the first inverter INV1, and the second transmission gate TG2 receives a feedback signal FB, and outputs the feedback signal TB when the second transmission gate TG2 is turned on. When the selection signal CHO is of a low level, the second transmission gate TG2 is turned on. In contrast, when the selection signal CHO is of a high level, the second transmission gate TG2 is turned off.

An input end of the first NOR gate Nor1 is connected to an input end of the first transmission gate TG1 and an output end of the ternary inverter T_INV respectively, another input end of the first NOR gate Nor1 is connected to an output end of the second transmission gate TG2 and a first electrode of the first transistor T1, and a signal outputted by the first NOR gate Nor1 is a signal OUT_Latch outputted by the latch circuit. The first electrode of the first transistor T1 is a source electrode (SOURCE) or a drain electrode (DRAIN) of the first transistor T1. When the first electrode of the first transistor T1 is the source electrode, the second electrode of the first transistor T1 is the drain electrode. When the first electrode of the first transistor T1 is the drain electrode, the second electrode of the first transistor T1 is the source electrode. A person skilled in the art may understand that the present disclosure is not limited thereto.

A control end of the ternary inverter T_INV which is effective when inputted with a low level receives the selection signal CHO, another control end of the ternary inverter T_INV which is effective when inputted with a high level receives the signal outputted by the first inverter INV1, and the ternary inverter T_INV receives the signal outputted by the first NOR gate Nor1, and processes the signal outputted by the first NOR gate Nor1 by a NOT operation to obtain a signal and outputs the obtained signal when the selection signal CHO is of a low level and the signal outputted by the first inverter INV1 is of a high level. As illustrated in FIG. 3, when the selection signal CHO is of a high level, the ternary inverter T_INV is in a high impedance state. In contrast, when the selection signal CHO is of a low level, the ternary inverter T_INV is turned on, and then processes the received signal by a NOT operation to obtain a signal and outputs the obtained signal.

As illustrated in FIG. 3, a gate electrode of the first transistor T1 receives the selection signal CHO, and the drain electrode of the first transistor T1 receives a low level signal VSS. A person skilled in the art may understand that, alternatively, the drain electrode of the first transistor T1 may receive the selection signal CHO, and the source electrode of the first transistor T1 may receive a low level signal Vss; the present disclosure is not limited thereto.

During a time period where the selection signal CHO is of a high level, the selection signal CHO is of a high level, the signal received by the first clock signal end CLKIN1 of the shift register unit is of a low level, the feedback signal FB is of a high level, and the signal outputted by the first inverter INV1 is of a low level. Thus, the first transmission gate TG1 is turned on; the second transmission gate TG2 is turned off, the first transistor T1 is turned on, and the ternary inverter T_INV is in the high impedance state. Thus, both signals received by the first NOR gate Nor1 are each of a low level, and the signal outputted by the first NOR gate Nor1 is of a high level.

During a first time period where the selection signal CHO is of a low level, the selection signal CHO is of a low level, the signal received by the first clock signal end CLKIN1 of the shift register unit is of a high level, the feedback signal FB is of a low level, and the signal outputted by the first inverter INV1 is of a high level. Thus, the first transmission gate TG1 is turned off, the second transmission gate TG2 is turned on, the first transistor T1 is turned off, the ternary inverter T_INV is turned on, and the ternary inverter T_INV processes the signal outputted by the first NOR gate Nor1 when the selection signal CHO is of a high level, i.e. a high level signal, by a NOT operation to obtain a signal, and outputs the obtained signal to an input end of the first NOR gate Nor1. Since the first transistor T1 is turned off and the second transmission gate TG2 is turned on, another input end of the first NOR gate Nor1 receives the feedback signal FB of a low level. Therefore, during the first time period where the selection signal is of a low level, the first NOR gate Nor1 still outputs the high level signal.

During the time period where the selection signal CHO is of a high level and the first time period where the selection signal CHO is of a low level, the signal outputted by the latch circuit is of a high level, the signal outputted by the transmission circuit is related to the clock signal received by the first clock signal end of the shift register unit, and the shift register unit is in its operation state.

During a time period from an end of the first time period where the selection signal CHO is of a first low level to a start of the selection signal CHO being turned to be of a high level again, the selection signal CHO is kept to be of a low level. Thus, the first transmission gate TG1 is turned off, the second transmission gate TG2 is turned on, the first transistor T1 is turned off, and the ternary inverter T_INV is turned on. Once the feedback signal FB is turned to be of a high level, the first NOR gate Nor1 receives a high level signal and then outputs a low level signal. Thus, the ternary inverter T_INV outputs a high level signal. As a result, the latch circuit keeps being in a state of outputting a low level signal, and the signal outputted by the latch circuit will not change until the selection signal CHO is turned to be of a high level again.

That is, during the time period from the end of the first time period where the selection signal CHO is of a first low level to the start of the selection signal CHO being turned to be of a high level again, once the feedback signal FB is turned to be of a high level, the latch circuit is changed from being in a state of outputting a high level signal to being in a state of outputting a low level signal; and when the latch circuit outputs a low level signal, the transmission circuit outputs a corresponding signal and the shift register unit is in its non-operation state. Furthermore, since the feedback signal FB is changed from being of a low level to being of a high level at the end of the first time period where the selection signal CHO is of a first low level, the shift register unit enters the operation state from the non-operation state at the end of the first time period where the selection signal CHO is of a first low level.

Figure 4:
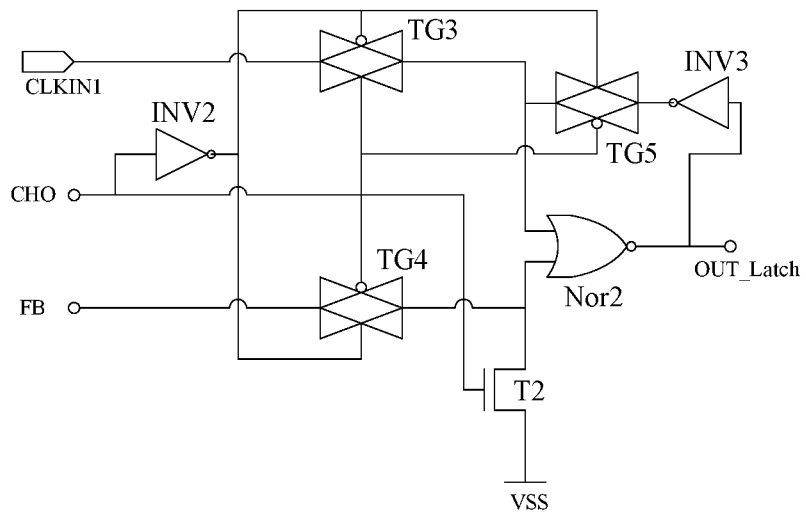
FIG. 4 is a second schematic diagram for the structure of the latch circuit in the shift register unit according to an embodiment of the present disclosure.

Alternatively, as an alternation of the embodiment as illustrated in FIG. 3, as illustrated in FIG. 4, the latch circuit includes a second inverter INV2, a third inverter INV3, a third transmission gate TG3, a fourth transmission gate TG4, a fifth transmission gate TG5, a second NOR gate Nor2 and a second transistor T2.

The second inverter INV2 receives the selection signal CHO, and processes the selection signal CHO by a NOT operation to obtain a signal and output the obtained signal. If the selection signal CHO is of a high level, the signal outputted by the second inverter INV2 is of a low level. In contrast, if the selection signal CHO is of a low level, the signal outputted by the second inverter INV2 is of a high level.

A control end of the third transmission gate TG3 is which is effective when inputted with a low level receives a signal outputted by the second inverter INV2, another control end of the third transmission gate TG3 is which is effective when inputted with a high level receives the selection signal CHO, an input end of the third transmission gate TG3 is connected to the first clock signal end CLKIN1 of the shift register unit, and the third transmission gate TG3 outputs the clock signal received by the input end of the third transmission gate TG3 when the third transmission gate TG3 is turned on. When the selection signal CHO is of a high level, the third transmission gate TG3 is turned on. In contrast, when the selection signal CHO is of a low level, the third transmission gate TG3 is turned off.

A control end of the fourth transmission gate TG4 which is effective when inputted with a low level receives the selection signal CHO, another control end of the fourth transmission gate TG4 which is effective when inputted with a high level receives the signal outputted by the second inverter INV2, and the fourth transmission gate TG4 receives the feedback signal FB, and outputs the feedback signal FB when the fourth transmission gate TG4 is turned on. When the selection signal CHO is of a low level, the fourth transmission gate TG4 is turned on. In contrast, when the selection signal CHO is of a high level, the fourth transmission gate TG4 is turned off.

An input end of the second NOR gate Nor2 is connected to an output end of the third transmission gate TG3 and an output end of the fifth transmission gate TG5 respectively, another input end of the second NOR gate Nor2 is connected to an output end of the fourth transmission gate TG4 and a first electrode of the second transistor T2, and a signal outputted by the second NOR gate Nor2 is the signal OUT_Latch outputted by the latch circuit. The first electrode of the second transistor T2 is a source electrode or a drain electrode of the second transistor T2. When the first electrode of the second transistor T2 is the source electrode, the second electrode of the second transistor T2 is the drain electrode. When the first electrode of the second transistor T2 is the drain electrode, the second electrode of the second transistor T2 is the source electrode. A person skilled in the art may understand that the present disclosure is not limited thereto.

The third inverter INV3 receives the signal outputted by the second NOR gate Nor2, and processes the signal outputted by the second NOR gate Nor2 by a NOT operation to obtain a signal and output the obtained signal. When the second NOR gate Nor2 outputs a high level signal, the third inverter INV3 outputs a low level signal. In contrast, when the second NOR gate Nor2 outputs a low level signal, the third inverter INV3 outputs a high level signal.

A control end of the fifth transmission gate TG5 which is effective when inputted with a low level receives the selection signal CHO, another control end of the fifth transmission gate TG5 which is effective when inputted with a high level receives the signal outputted by the second inverter INV2, and the fifth transmission gate TG5 receives the signal outputted by the third inverter INV3, and outputs the signal outputted by the third inverter INV3 when the selection signal CHO is of a low level. When the selection signal CHO is of a low level, the fifth transmission gate TG5 is turned on. In contrast, when the selection signal CHO is of a high level, the fifth transmission gate TG5 is turned off.

As illustrated in FIG. 4, a gate electrode of the second transistor T2 receives the selection signal CHO, and the drain electrode of the second transistor T2 receives a low level signal VSS. A person skilled in the art may understand that, alternatively, the drain electrode of the second transistor T2 may receive the selection signal CHO, and the source electrode of the second transistor T2 may receive a low level signal Vss; the present disclosure is not limited thereto.

During a time period where the selection signal CHO is of a high level, the selection signal CHO is of a high level, the clock signal received by the first clock signal end CLKIN1 of the shift register unit is of a low level, the feedback signal FB is of a high level, and the signal outputted by the second inverter INV2 is of a low level. As a result, the third transmission gate TG3 is turned on, the fourth transmission gate TG4 is turned off, the fifth transmission gate TG5 is turned off, and the second transistor T2 is turned on. Thus, both signals received by the second NOR gate Nor2 are each of a low level, and the signal outputted by the second NOR gate Nor2 is of a high level.

During a first time period where the selection signal CHO is of a low level, the selection signal CHO is of a low level, the clock signal received by the first clock signal end CLKIN1 of the shift register unit is of a high level, the feedback signal FB is of a low level, and the signal outputted by the second inverter INV2 is of a high level. As a result, the third transmission gate TG3 is turned off, the fourth transmission gate TG4 is turned on, the fifth transmission gate TG5 is turned on, and the second transistor T2 is turned off. The third inverter INV3 processes the signal outputted by the second NOR gate Nor2 when the selection signal CHO is of a high level, i.e. a high level signal, by a NOT operation to obtain a signal, and outputs the obtained signal to an input end of the second NOR gate Nor2 via the fifth transmission gate TG5. Since the second transistor T2 is turned off, and the fourth transmission gate TG4 is turned on, another input end of the second NOR gate Nor2 receives the feedback signal FB of a low level. Thus, during the first time period where the selection signal is of a low level, the second NOR gate Nor2 still outputs a high level signal.

During the time period where the selection signal CHO is of a high level and the first time period where the selection signal CHO is of a low level, the signal outputted by the latch circuit is of a high level, the signal outputted by the transmission circuit is related to the clock signal received by the first clock signal end of the shift register unit, and the shift register unit is in its operation state.

During a time period from an end of the first time period where the selection signal CHO is of a first low level to a start of the selection signal CHO being turned to be of a high level again, the selection signal CHO is kept to be of a low level. Thus, the third transmission gate TG3 is turned off, the fourth transmission gate TG4 is turned on, the fifth transmission gate TG5 is turned on, and the second transistor T2 is turned off. Once the feedback signal FB is turned to be of a high level, the second NOR gate Nor2 receives a high level signal and outputs a low level signal, thus the third inverter INV3 outputs a high level signal. As a result, the latch circuit keeps being in a state of outputting a low level signal, and the signal outputted by the latch circuit will not change until the selection signal CHO is turned to be of a high level again.

That is, during the time period from the end of the first time period where the selection signal CHO is of a first low level to the start of the selection signal CHO being turned to be of a high level again, once the feedback signal FB is turned to be of a high level, the latch circuit is changed from being in the state of outputting a high level signal to being in a state of outputting a low level signal; and when the latch circuit outputs a low level signal, the transmission circuit outputs a corresponding signal, and the shift register unit is in its non-operation state.

Third and Fourth Embodiments Regarding Transmission Circuit

Figure 5:
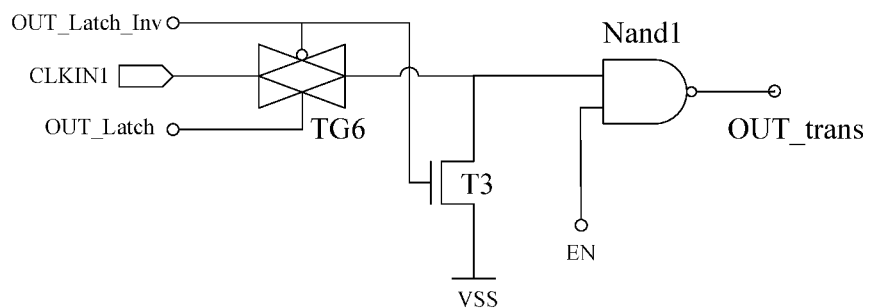
FIG. 5 is a first schematic diagram for a structure of a transmission circuit in the shift register unit according to an embodiment of the present disclosure.

Alternatively, as illustrated in FIG. 5, the transmission gate includes a sixth transmission gate TG6, a third transistor T3 and a first NAND gate Nand1.

A control end of the sixth transmission gate TG6 which is effective when inputted with a high level receives the signal OUT_Latch outputted by the latch circuit, another control end of the sixth transmission gate TG6 which is effective when inputted with a low level receives a signal OUT_Latch_Inv obtained by processing the signal OUT_Latch outputted by the latch circuit by a NOT operation, an input end of the sixth transmission gate TG6 is connected to the first clock signal end CLKIN1 of the shift register unit, and the sixth transmission gate TG6 outputs the signal received by the input end of the sixth transmission gate TG6 when the signal OUT_Latch outputted by the latch circuit is of a high level.

An input end of the first NAND gate Nand1 receives an enable signal EN, another input end of the first NAND gate Nand1 is connected to an output end of the sixth transmission gate TG6 and a first electrode of the third transistor T3 respectively, and a signal outputted by the first NAND gate Nand1 is a signal OUT_Trans outputted by the transmission circuit. The enable signal EN is of a high level during a time period of one frame for displaying an image.

A gate electrode of the third transistor T3 receives the signal OUT_Latch_Inv obtained by processing the signal OUT_Latch outputted by the latch circuit by a NOT operation, and a second electrode of the third transistor T3 receives a low level signal VSS. When the first electrode of the third transistor T3 is the source electrode, the second electrode of the third transistor T3 is the drain electrode. In contrast, when the first electrode of the third transistor T3 is the drain electrode, the second electrode of the third transistor T3 is the source electrode.

When the signal OUT_Latch outputted by the latch circuit is of a high level, the sixth transmission gate TG6 is turned on, the third transistor T3 is turned off, and the sixth transmission gate TG6 outputs the clock signal received by its input end to an input end of the first NAND gate Nand1. At this time, the enable signal EN is of a high level, and if the clock signal received by the input end of the sixth transmission gate TG6 is of a low level, the first NAND gate Nand1 outputs a high level signal. In contrast, if the clock signal received by the input end of the sixth transmission gate TG6 is of a high level, the first NAND gate Nand1 outputs a low level signal. When the signal OUT_Latch outputted by the latch circuit is of a low level, the sixth transmission gate TG6 is turned off, and the third transistor T3 is turned on. Thus, the low level signal VSS is transmitted to the input end of the first NAND gate Nand1 via the third transistor T3. At this time, the first NAND gate Nand1 outputs a high level signal.

Figure 6:
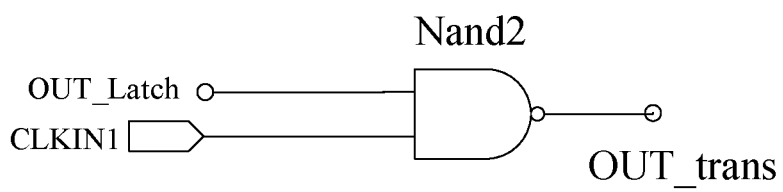
FIG. 6 is a second schematic diagram for the structure of the transmission circuit in the shift register unit according to an embodiment of the present disclosure.

Alternatively, as an alternation of the embodiment as illustrated in FIG. 5, as illustrated in FIG. 6, the transmission circuit includes a second NAND gate Nand2. An input end of the second NAND gate Nand2 receives the signal OUT_Latch outputted by the latch circuit, another input end of the second NAND gate Nand2 is connected to the first clock signal end CLKIN1 of the shift register unit, and a signal outputted by the second NAND gate NAND2 is a signal OUT_Trans outputted by the transmission circuit.

When the signal outputted by the latch circuit is of a high level, the signal outputted by the second NAND gate Nand2 is a signal obtained by processing the clock signal received by the first clock signal end CLKIN1 of the shift register unit by a NOT operation. In other words, when the clock signal received by the first clock signal end CLKIN1 of the shift register unit is of a high level, the second NAND gate Nand2 outputs a low level signal. In contrast, when the clock signal received by the first clock signal end CLKIN1 of the shift register unit is a low level signal, the second NAND gate Nand2 outputs a high level signal.

Fifth Embodiment Regarding Buffer Circuit

In this optional embodiment of the present disclosure, it is provided that the shift register unit further includes a buffer circuit to enhance the driving capability of the shift register unit. The buffer circuit receives the signal OUT_Trans outputted by the transmission circuit, and processes the signal OUT_Trans outputted by the transmission circuit by a NOT operation to obtain a signal and output the obtained signal. That is, when the signal OUT_Trans outputted by the transmission circuit is of a high level, the signal OUT_Buffer outputted by the buffer circuit is of a low level. When the signal OUT_Trans outputted by the transmission circuit is of a low level, the signal OUT_Buffer outputted by the buffer circuit is of a high level. In embodiments of the present disclosure, when the shift register unit includes the buffer circuit, the signal OUT_Buffer outputted by the buffer circuit is the signal OUT outputted by the shift register unit.

Figure 7:
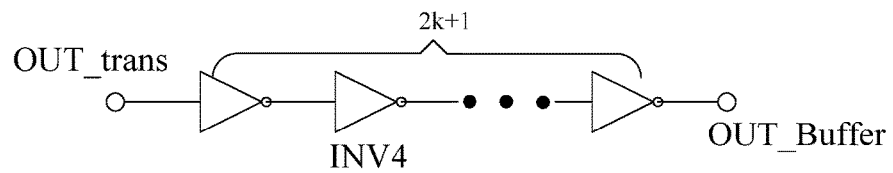
FIG. 7 is a schematic diagram for a structure of a buffer circuit in the shift register unit according to an embodiment of the present disclosure.

Alternatively, as illustrated in FIG. 7, the buffer circuit includes 2k+1 fourth inverts INV4 which are connected in series. An input end of a first fourth inverter of the 2k+1 fourth inverters INV4 receives the signal OUT_Trans outputted by the transmission circuit. For each of the 2k+1 number of fourth inverters INV4 except the first fourth inverter, an output end of a previous fourth inverter INV4 is connected to an input end of a succeeding fourth inverter INV4, and an output end of the last one of the 2k+1 fourth inverters INV4 is an output end of the buffer circuit. The 2k+1 fourth inverters connected in series process the signal OUT_Trans outputted by the transmission circuit by NOT operations to obtain a signal and output the obtained signal, wherein k is a nonnegative integer. If k=0, the buffer circuit merely includes one fourth inverter.

Sixth Embodiment Regarding Scanning Direction Selecting Circuit

In the embodiment of the present disclosure, the shift register unit further includes a scanning direction selecting circuit, so that the shift register unit may scan forwardly or backwardly. The scanning direction selecting circuit outputs a forward selection signal CHOF as the selection signal CHO when a forward control signal FS is of a high level and a backward control signal BS is of a low level. In contrast, the scanning direction selecting circuit outputs a backward selection signal CHOB as the selection signal CHO when a forward control signal FS is of a low level and a backward control signal BS is of a high level.

Figure 8:
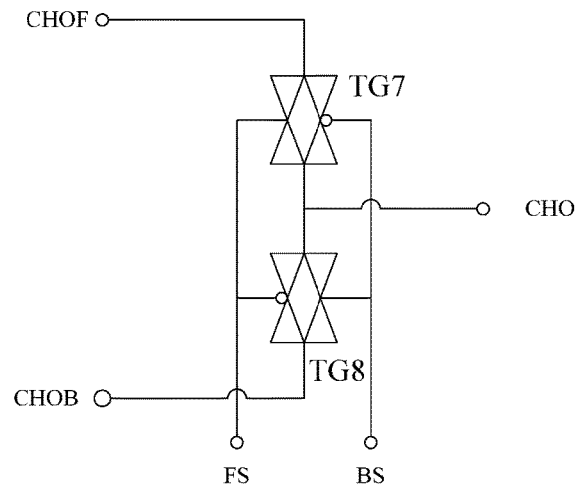
FIG. 8 is a schematic diagram for a structure of a scanning direction selecting circuit in the shift register unit according to an embodiment of the present disclosure.

Alternatively, as illustrated in FIG. 8, the scanning direction selecting circuit includes a seventh transmission gate TG7 and an eighth transmission gate TG8. A control end of the seventh transmission gate TG7 which is effective when inputted with a high level receives the forward control signal FS, another control end of the seventh transmission gate TG7 which is effective when inputted with a low level receives the backward control signal BS, and the seventh transmission gate TG7 receives the forward selection signal CHOF, and outputs the forward selection signal CHOF when the forward control signal FS is of a high level and the backward control signal BS is of a low level. Furthermore, when the forward control signal FS is of a high level and the backward control signal BS is of a low level, the seventh transmission gate TG7 is turned on. In contrast, when the forward control signal FS is of a low level and the backward control signal BS is of a high level, the seventh transmission gate TG7 is turned off.

A control end of the eighth transmission gate TG8 which is effective when inputted with a high level receives the backward control signal BS, another control end of the eighth transmission gate TG8 which is effective when inputted with a low level receives the forward control signal FS, and the eighth transmission gate TG8 receives the backward selection signal CHOB, and outputs the backward selection signal CHOB when the forward control signal FS is of a low level and the backward control signal BS is of a high level. Furthermore, when the forward control signal FS is of a high level and the backward control signal BS is of a low level, the eighth transmission gate TG8 is turned off. In contrast, when the forward control signal FS is of a low level and the backward control signal BS is of a high level, the eighth transmission gate TG8 is turned on.

In embodiments of the present disclosure, the clock signal received by the first clock signal end of the shift register unit is a first clock signal CLK1 or a second clock signal CLK2. When the first clock signal CLK1 is of a high level, the second clock signal CLK2 is of a low level. When the second clock signal CLK2 is of a high level, the first clock signal CLK1 is of a low level.

Alternatively, the feedback signal FB is obtained by processing the forward selection signal CHOF and the backward selection signal CHOB by an OR operation. The forward selection signal CHOF is the selection signal CHO during a forward scanning, and the backward selection signal CHOB is the selection signal CHO during a backward scanning.

Alternatively, the feedback signal FB is a clock signal received by the second clock signal end CLKIN2 of the shift register unit. When the clock signal received by the first clock signal end CLKIN1 of the shift register unit is of a high level, the clock signal received by the second clock signal end CLKIN2 of the shift register unit is of a low level. Furthermore, when the clock signal received by the second clock signal end CLKIN2 of the shift register unit is of a high level, the clock signal received by the first clock signal end CLKIN1 of the shift register unit is of a low level. Thus, when the signal received by the first clock signal end CLKIN1 of the shift register unit is the first clock signal CLK1, the feedback signal FB, i.e. the signal received by the second clock signal end CLKIN2 of the shift register unit is the second clock signal CLK2. When the clock signal received by the first clock signal end CLKIN1 of the shift register unit is the second clock signal CLK2, the feedback signal FB, i.e. the signal received by the second clock signal end CLKIN2 of the shift register unit is the first clock signal CLK1.

Alternatively, the feedback signal FB is the signal OUT_Trans outputted by the transmission circuit.

Seventh and Eighth Embodiments Regarding Shift Register Unit

Figure 9:
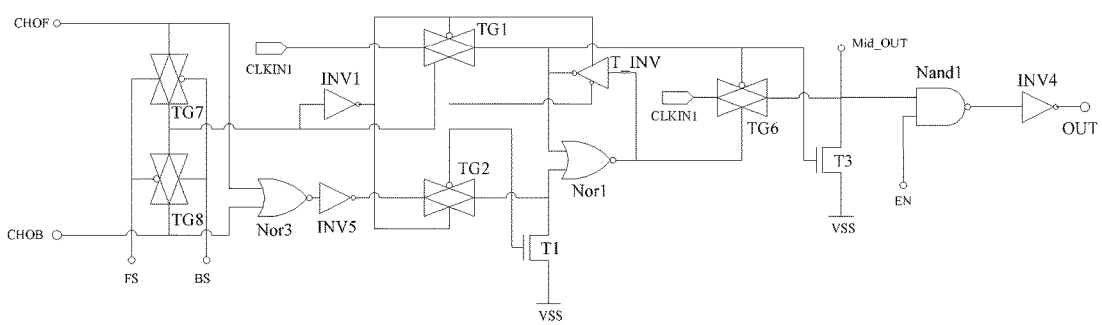
FIG. 9 is a first schematic diagram for the structure of the shift register unit according to an embodiment of the present disclosure.

In the seventh embodiment of the present disclosure, the shift register unit is as illustrated in FIG. 9, wherein the feedback signal FB is obtained by processing the forward selection signal CHOF and the backward selection signal CHOB by an OR operation, the shift register unit includes the latch circuit, the transmission circuit, the buffer circuit, and the scanning direction selecting circuit. The latch circuit is as illustrated in FIG. 3, the transmission circuit is as illustrated in FIG. 5, the buffer circuit merely includes one fourth inverter, and the scanning direction selecting circuit is as illustrated in FIG. 8.

Figure 10:
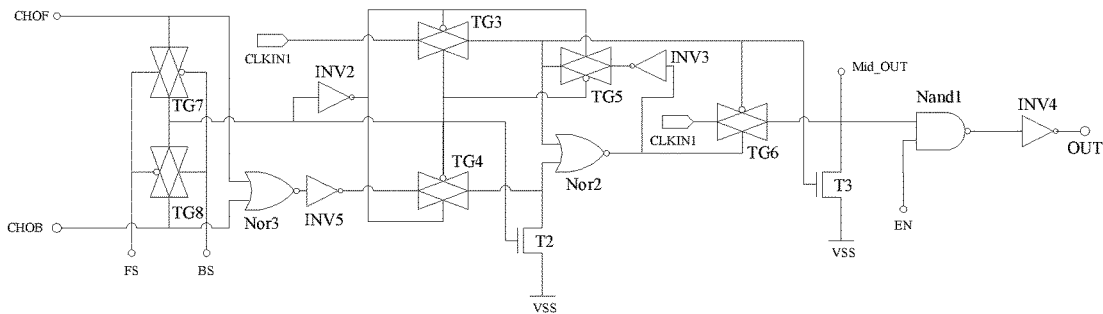
FIG. 10 is a second schematic diagram for the structure of the shift register unit according to an embodiment of the present disclosure.

In the eighth embodiment of the present disclosure, in the shift register unit is as illustrated in FIG. 10, wherein the feedback signal FB is obtained by processing the forward selection signal CHOF and the backward selection signal CHOB by an OR operation, the shift register unit includes the latch circuit, the transmission circuit, the buffer circuit, and the scanning direction selecting circuit. The latch circuit is as illustrated in FIG. 4, the transmission circuit is as illustrated in FIG. 5, the buffer circuit merely includes one fourth inverter, and the scanning direction selecting circuit is as illustrated in FIG. 8.

The third NOR gate Nor3 and the fifth inverter INV5 as illustrated in FIGS. 9 and 10 is used to process the forward selection signal CHOF and the backward selection signal CHOB by an OR operation. In the following, it is assumed that the clock signal received by the first clock signal end CLKIN1 of the shift register unit as illustrated in FIG. 9 or 10 is the first clock signal CLK1. Obviously, the clock signal received by the first clock signal end CLKIN1 of the shift register unit as illustrated in FIG. 9 or 10 can alternatively be the second clock signal CLK2.

Figure 11:
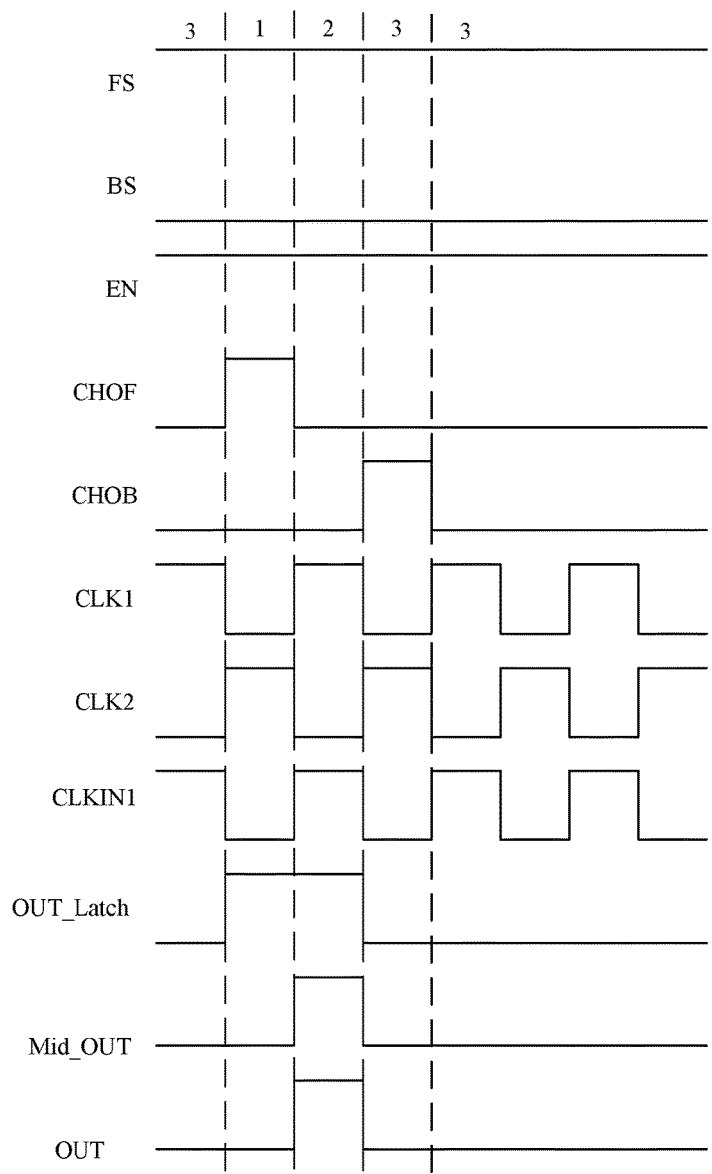
FIG. 11 illustrates a workflow diagram for a forward scanning by the shift register unit as illustrated in FIG. 9 or 10.

When the shift register unit as illustrated in FIGS. 9 and 10 scans forwardly, the forward control signal FS is of a high level, the backward control signal BS is of a low level. Thus, the seventh transmission gate TG7 is turned on, the eighth transmission gate TG8 is turned off, the forward selection signal CHOF is the selection signal CHO, and the workflow of the shift register unit is as illustrated in FIG. 11. In the following, it is assumed that the clock signal received by the first clock signal end CLKIN1 of the shift register unit as illustrated in FIG. 9 or 10 is the first clock signal CLK1; obviously, the clock signal received by the first clock signal end CLKIN1 of the shift register unit as illustrated in FIG. 9 or 10 can alternatively be the second clock signal CLK2.

During a first stage, i.e. a time period where the selection signal CHO (i.e. the forward selection signal CHOF) is of a high level, the signal OUT_Latch outputted by the latch circuit is of a high level. Thus, the sixth transmission gate TG6 as illustrated in FIG. 9 or 10 is turned on, and the third transistor T3 is turned off, so that the clock signal received by the first clock signal end CLKIN1 of the shift register unit is transmitted to an input end of the first NAND gate Nand1, into which a signal Mid_OUT is inputted. During the first stage, the clock signal received by the first clock signal end CLKIN1 of the shift register unit is of a low level, and the enable signal EN is of a high level. Thus, in the first stage, the signal OUT outputted by the shift register unit as illustrated in FIG. 9 or 10 is of a low level.

During a second stage, i.e. a time period where the selection signal CHO (i.e. the forward selection signal CHOF) is of a low level, the signal OUT_Latch outputted by the latch circuit is still of a high level. Thus, the sixth transmission gate TG6 as illustrated in FIG. 9 or 10 is turned on, and the third transistor T3 is turned off, so that the clock signal received by the first clock signal end CLKIN1 of the shift register unit is transmitted to the input end of the first NAND gate Nand1. During the second stage, the clock signal received by the first clock signal end CLKIN1 of the shift register unit is of a high level, and the enable signal EN is of a high level. Thus, in the second stage, the signal OUT outputted by the shift register unit as illustrated in FIG. 9 or 10 is of a high level.

Upon entering a third stage from the second stage, since the backward selection signal CHOB is turned to be of a high level and the forward selection signal CHOF is still of a low level, the signal obtained by processing the forward selection signal CHOF and the backward selection signal CHOB by the third NOR gate Nor4 and the fifth inverter INV5 is changed from being of a low level to being of a high level, so that the signal OUT_Latch outputted by the latch circuit is changed from being of a high level to being of a low level. That is, upon entering the third stage from the second stage, the backward selection signal CHOB is changed from being of a low level to being of a high level, so that the signal OUT_Latch outputted by the latch circuit is changed from being of a high level to being of a low level, and thus the sixth transmission gate TG6 as illustrated in FIG. 9 or 10 is turned off, the third transistor T3 is turned on, and a low level signal VSS is transmitted to an input end of the first NAND gate Nand1. Thus, in the third stage, the input end of the first NAND gate Nand1 receives the low level signal VSS, another input end of the first NAND gate Nand1 receives the enable signal EN which is of a high level in the third stage. Thus, in the third stage, the signal OUT outputted by the shift register unit as illustrated in FIG. 9 or 10 is of a low level.

After that, the shift register unit as illustrated in FIG. 9 or 10 is kept to be in the third stage, until the forward selection signal CHOF is turned to be of a high level again. Then the shift register unit as illustrated in FIG. 9 or 10 enters the first stage from the third stage. During the first and second stages, the shift register unit as illustrated in FIGS. 9 and 10 is in the operation state, while during the third stage, the shift register unit as illustrated in FIGS. 9 and 10 is in the non-operation state.

Figure 12:
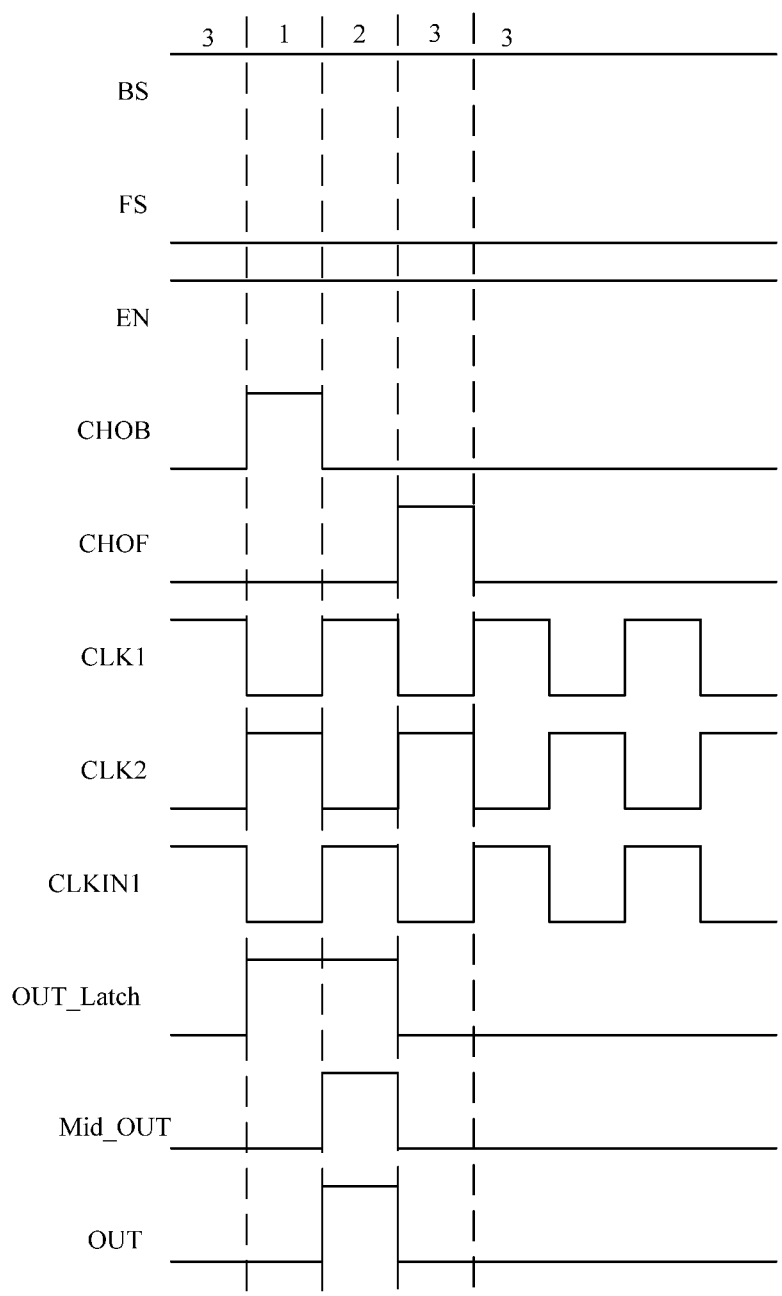
FIG. 12 illustrates a workflow diagram for a backward scanning by the shift register unit as illustrated in FIG. 9 or 10.

When the shift register unit as illustrated in FIGS. 9 and 10 scans backwardly, the backward control signal BS is of a high level, the forward control signal FS is of a low level. Thus, the seventh transmission gate TG7 is turned off, the eighth transmission gate TG8 is turned on, the backward selection signal CHOB is the selection signal CHO, and the workflow of the shift register unit is as illustrated in FIG. 12. When the shift register unit as illustrated in FIG. 9 or 10 scans backwardly, the operations of the latch circuit, the transmission circuit and the buffer circuit are exactly same as the operations of those circuits when the shifter register unit scans forwardly, and thus the descriptions thereof are omitted herein.

When the shift register unit as illustrated in FIG. 9 or 10 scans, it is unnecessary to adopt a pair of complementary and inverted clock signal to control the turning on and off of the transmission gate, and the clock signals may not be inputted into input ends of logic gates (the NOR gate, the NAND gate, and the inverter). Thus, when the shift register unit is in the non-operation state, the gate capacitor may not be charged and discharged, which reduces the meaningless power consumption of the shift register unit in the non-operation state.

Ninth and Tenth Embodiments Regarding Shift Register Unit

Figure 13:
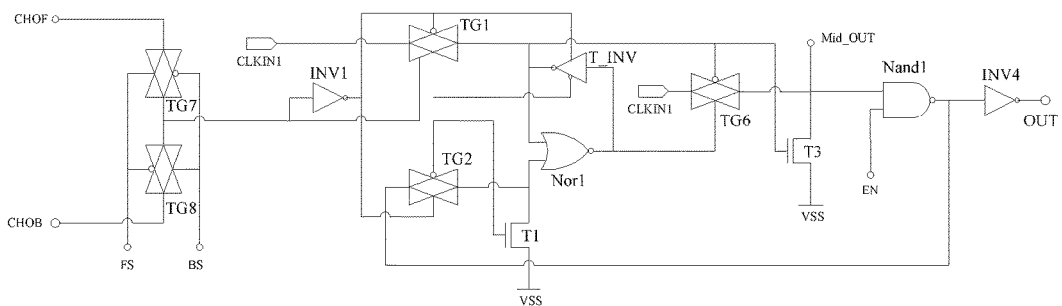
FIG. 13 is a third schematic diagram for the structure of the shift register unit according to an embodiment of the present disclosure.

In the ninth embodiment of the present disclosure, the shift register unit is as illustrated in FIG. 13, wherein the feedback signal FB is the signal OUT_Trans outputted by the transmission circuit, the shift register unit includes the latch circuit, the transmission circuit, the buffer circuit, and the scanning direction selecting circuit. The latch circuit is as illustrated in FIG. 3, the transmission circuit is as illustrated in FIG. 5, the buffer circuit merely includes one fourth inverter, and the scanning direction selecting circuit is as illustrated in FIG. 8.

Figure 14:
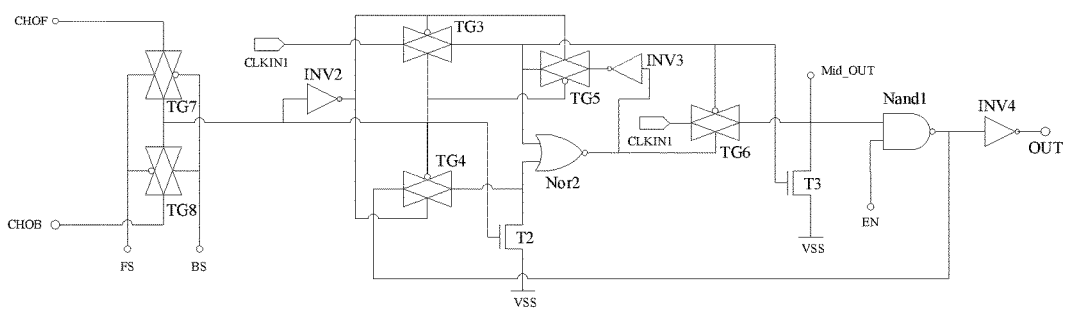
FIG. 14 is a fourth schematic diagram for the structure of the shift register unit according to an embodiment of the present disclosure.

In the tenth embodiment of the present disclosure, the shift register unit is as illustrated in FIG. 14, wherein the feedback signal FB is the signal OUT_Trans outputted by the transmission circuit, the shift register unit includes the latch circuit, the transmission circuit, the buffer circuit, and the scanning direction selecting circuit. The latch circuit is as illustrated in FIG. 4, the transmission circuit is as illustrated in FIG. 5, the buffer circuit merely includes one fourth inverter, and the scanning direction selecting circuit is as illustrated in FIG. 8.

Figure 15:
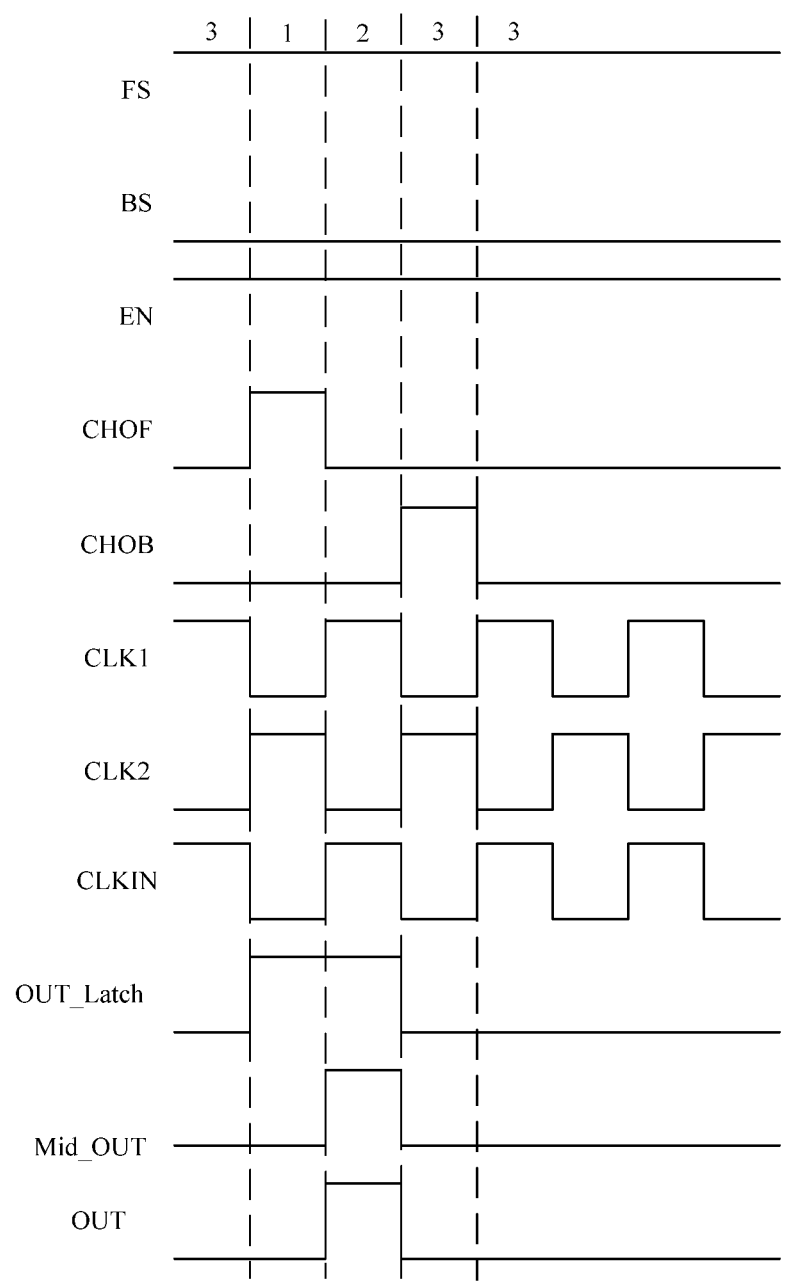
FIG. 15 illustrates a workflow diagram for a forward scanning by the shift register unit as illustrated in FIG. 13 or 14.

When the shift register unit as illustrated in FIGS. 13 and 14 scans forwardly, the forward control signal FS is of a high level, the backward control signal BS is of a low level. Thus, the seventh transmission gate TG7 is turned on, the eighth transmission gate TG8 is turned off, the forward selection signal CHOF is the selection signal CHO, and the workflow of the shift register unit is as illustrated in FIG. 15. In the following, it is assumed that the clock signal received by the first clock signal end CLKIN1 of the shift register unit as illustrated in FIG. 13 or 14 is the first clock signal CLK1; obviously, the clock signal received by the first clock signal end CLKIN1 of the shift register unit as illustrated in FIG. 13 or 14 can alternatively be the second clock signal CLK2.

During a first stage, i.e. a time period where the selection signal CHO (i.e. the forward selection signal CHOF) is of a high level, the signal OUT_Latch outputted by the latch circuit is of a high level. Thus, the sixth transmission gate TG6 as illustrated in FIG. 13 or 14 is turned on, and the third transistor T3 is turned off, so that the clock signal received by the first clock signal end CLKIN1 of the shift register unit is transmitted to an input end of the first NAND gate Nand1, into which a signal Mid_OUT is inputted. During the first stage, the clock signal received by the first clock signal end CLKIN1 of the shift register unit is of a low level, and the enable signal EN is of a high level. Thus, in the first time period, the signal OUT outputted by the shift register unit as illustrated in FIG. 13 or 14 is of a low level.

During a second stage, i.e. a time period where the selection signal CHO (i.e. the forward selection signal CHOF) is of a low level, the signal OUT_Latch outputted by the latch circuit is still of a high level. Thus, the sixth transmission gate TG6 as illustrated in FIG. 13 or 14 is turned on, and the third transistor T3 is turned off, so that the signal received by the first clock signal end CLKIN1 of the shift register unit is transmitted to the input end of the first NAND gate Nand1. During the second stage, the clock signal received by the first clock signal end CLKIN1 of the shift register unit is of a high level, and the enable signal EN is of a high level. Thus, in the second stage, the signal OUT outputted by the shift register unit as illustrated in FIG. 13 or 14 is of a high level.

Upon entering a third stage from the second stage, since the clock signal received by the first clock signal end CLKIN1 of the shift register unit is turned to be of a low level from being the high level, the sixth transmission gate TG6 and the third transistor T3 are still kept to be in the same state as the state during the second stage, i.e. the sixth transmission gate TG6 is turned on, and the third transistor T3 is turned off. Thus, the signal OUT outputted by the shift register unit as illustrated in FIG. 13 or 14 is changed from being of a high level to be of a low level, i.e. the signal OUT_Trans outputted by the transmission circuit (i.e. the signal outputted by the first NAND gate Nand1) is changed from being of a low level to be of a high level. That is, the feedback signal FB is changed from being of a low level to be of a high level, so that the signal OUT_Latch outputted by the latch circuit is changed from being of a high level to be of a low level. That is, upon entering the third stage from the second stage, the time signal received by the first clock signal end CLKIN1 of the shift register unit is changed from being of a high level to be of a low level, so that the signal OUT_Latch outputted by the latch circuit is changed from being of a high level to be of a low level. Thus, the sixth transmission gate TG6 as illustrated in FIG. 13 or 14 is turned off, the third transistor T3 is turned on, and a low level signal VSS is transmitted to the input end of the first NAND gate Nand1. As a result, during the third stage, one input end of the first NAND gate Nand1 receives the low level signal VSS, and another input end of the first NAND gate Nand1 receives the enable signal EN. In the third stage, the enable signal EN is of a high level. Thus, in the third stage, the signal OUT outputted by the shift register unit as illustrated in FIG. 13 or 14 is of a low level.

After that, the shift register unit as illustrated in FIG. 13 or 14 is kept to be in the third stage, until the forward selection signal CHOF is turned to be of a high level again. Then the shift register unit as illustrated in FIG. 13 or 14 enters the first stage from the third stage. During the first and second stages, the shift register unit as illustrated in FIGS. 13 and 14 is in the operation state, while during the third stage, the shift register unit as illustrated in FIGS. 13 and 14 is in the non-operation state. When scanning forwardly, the backward selection signal CHOB does not affect the various circuits in the shift register unit.

Figure 16:
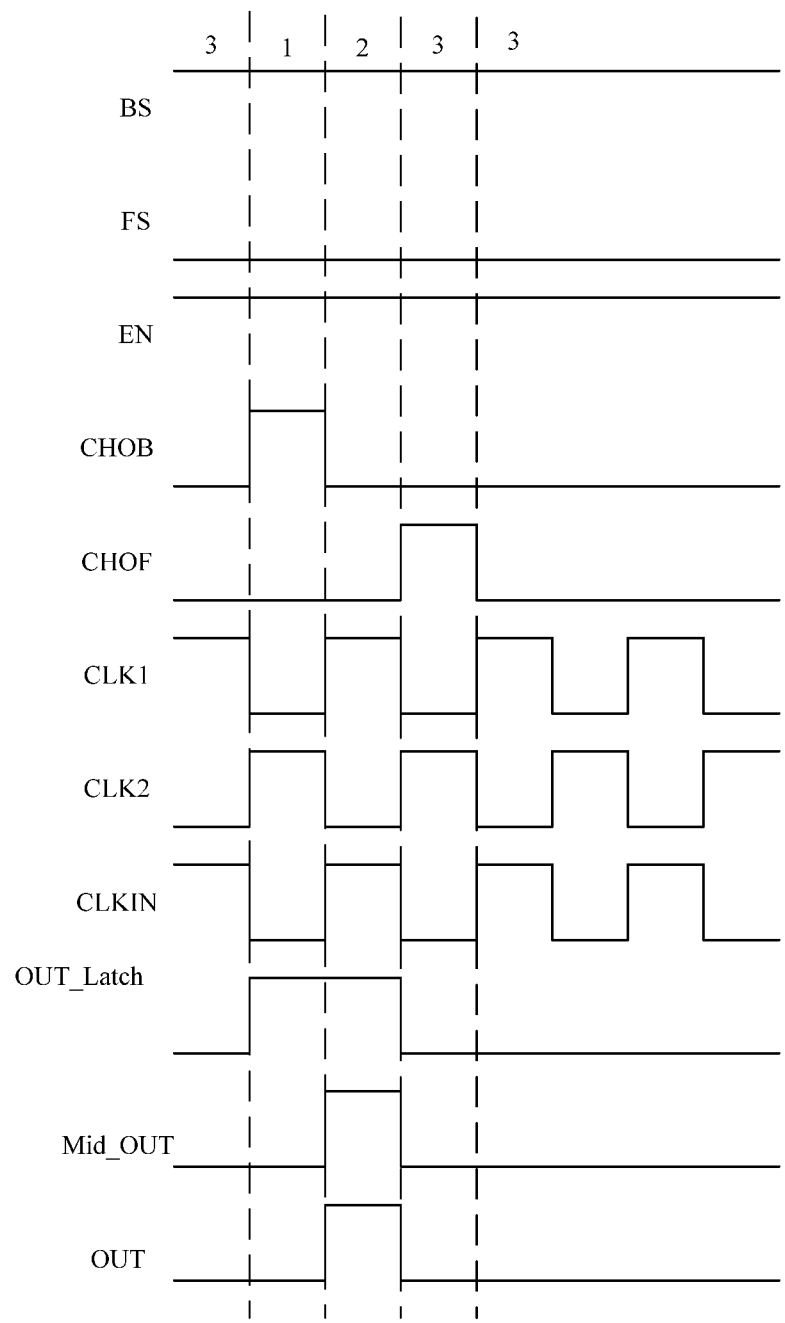
FIG. 16 illustrates a workflow diagram for a backward scanning by the shift register unit as illustrated in FIG. 13 or 14.

When the shift register unit as illustrated in FIGS. 13 and 14 scans backwardly, the backward control signal BS is of a high level, the forward control signal FS is of a low level. Thus, the seventh transmission gate TG7 is turned off, the eighth transmission gate TG8 is turned on, the backward selection signal CHOB is the selection signal CHO, and the workflow of the shift register unit is as illustrated in FIG. 16. When the shift register unit as illustrated in FIG. 13 or 14 scans backwardly, the operations of the latch circuit, the transmission circuit and the buffer circuit are exactly same as the operations of those circuits when the shifter register unit scans forwardly, and thus the descriptions thereof are omitted herein. When scanning backwardly, the backward selection signal CHOF does not affect the various circuits in the shift register unit.

When the shift register unit as illustrated in FIG. 13 or 14 scans, it is unnecessary to adopt a pair of clock signal CLK to control the turning on and off of the transmission gate, and the clock signals may not be inputted into input ends of logic gates (the NOR gate, the NAND gate, and the inverter). Thus, when the shift register unit is in the non-operation state, the gate capacitor may not be charged and discharged, which reduces the meaningless power consumption of the shift register unit in the non-operation state. However, there is a risk of logic competition in the shift register unit as illustrated in FIG. 13 or 14 when a duty ratio of the clock signal is less than 50%.

Eleventh and Twelfth Embodiments Regarding Shift Register Unit

Figure 17:
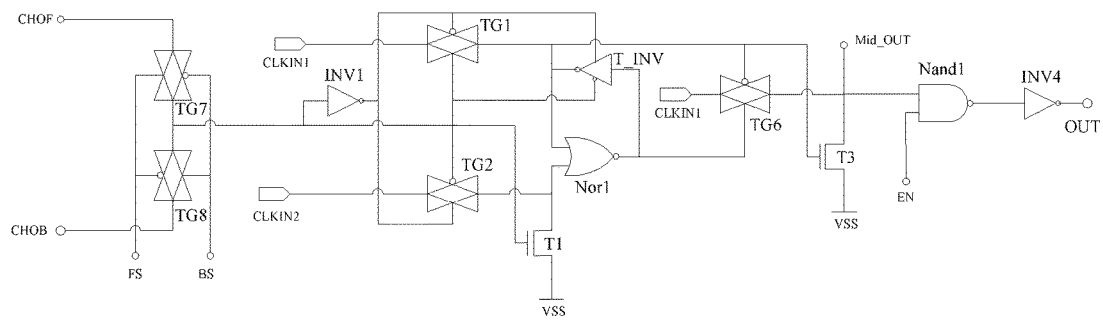
FIG. 17 is a fifth schematic diagram for the structure of the shift register unit according to an embodiment of the present disclosure.

In the eleventh embodiment of the present disclosure, the shift register unit is as illustrated in FIG. 17, wherein the feedback signal FB is the clock signal received by the second clock signal end CLKIN2 of the shift register unit, the shift register unit includes the latch circuit, the transmission circuit, the buffer circuit, and the scanning direction selecting circuit. And the latch circuit is as illustrated in FIG. 3, the transmission circuit is as illustrated in FIG. 5, the buffer circuit merely includes one fourth inverter, and the scanning direction selecting circuit is as illustrated in FIG. 8.

Figure 18:
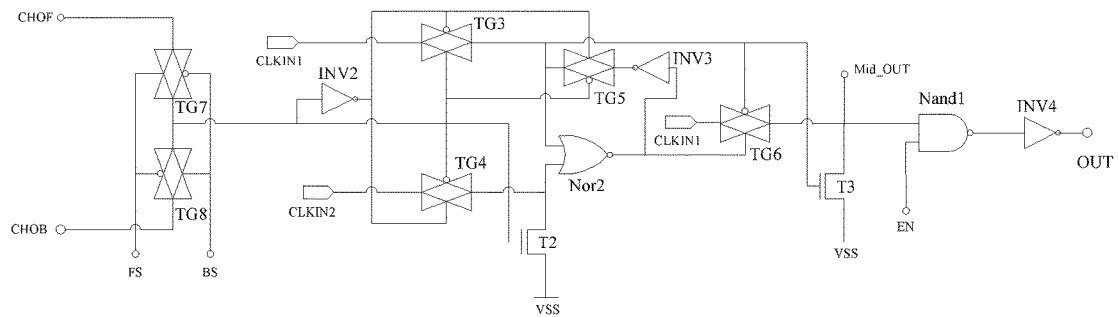
FIG. 18 is a sixth schematic diagram for the structure of the shift register unit according to an embodiment of the present disclosure.

In the twelfth embodiment of the present disclosure, the shift register unit is as illustrated in FIG. 18, wherein the feedback signal FB is the clock signal received by the second clock signal end CLKIN2 of the shift register unit, the shift register unit includes the latch circuit, the transmission circuit, the buffer circuit, and the scanning direction selecting circuit. The latch circuit is as illustrated in FIG. 4, the transmission circuit is as illustrated in FIG. 5, the buffer circuit merely includes one fourth inverter, and the scanning direction selecting circuit is as illustrated in FIG. 8.

Figure 19:
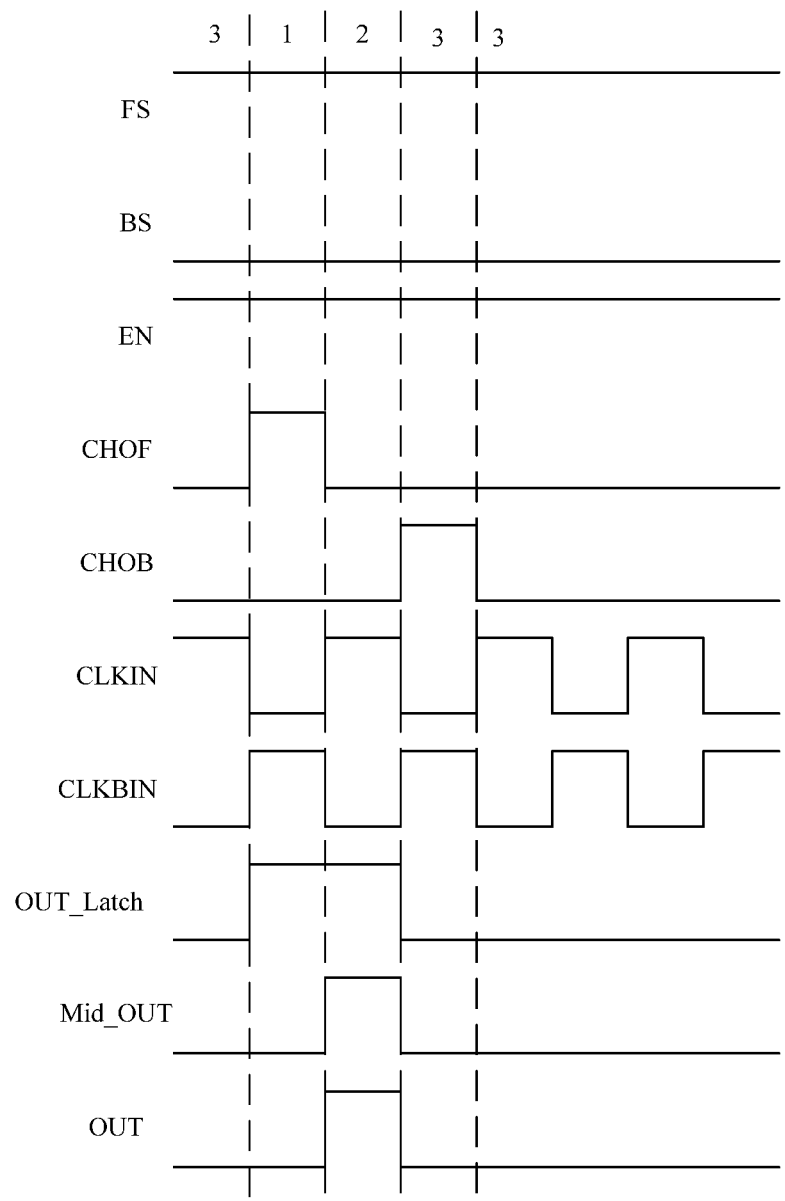
FIG. 19 illustrates a workflow diagram for a forward scanning by the shift register unit as illustrated in FIG. 17 or 18.

When the shift register unit as illustrated in FIGS. 17 and 18 scans forwardly, the forward control signal FS is of a high level, the backward control signal BS is of a low level. Thus, the seventh transmission gate TG7 is turned on, the eighth transmission gate TG8 is turned off, the forward selection signal CHOF is the selection signal CHO, and the workflow of the shift register unit is as illustrated in FIG. 19.

During a first stage, i.e. a time period where the selection signal CHO (i.e. the forward selection signal CHOF) is of a high level, the signal OUT_Latch outputted by the latch circuit is of a high level. Thus, the sixth transmission gate TG6 as illustrated in FIG. 17 or 18 is turned on, and the third transistor T3 is turned off, so that the clock signal received by the first clock signal end CLKIN1 of the shift register unit is transmitted to an input end of the first NAND gate Nand1, into which a signal Mid_OUT is inputted. During the first stage, the clock signal received by the first clock signal end CLKIN1 of the shift register unit is of a low level, and the enable signal EN is of a high level. Thus, in the first stage, the signal OUT outputted by the shift register unit as illustrated in FIG. 17 or 18 is of a low level.

During a second stage, i.e. a time period where the selection signal CHO (i.e. the forward selection signal CHOF) is of a low level, the signal OUT_Latch outputted by the latch circuit is still of a high level. Thus, the sixth transmission gate TG6 as illustrated in FIG. 17 or 18 is turned on, and the third transistor T3 is turned off, so that the signal received by the first clock signal end CLKIN1 of the shift register unit is transmitted to the input end of the first NAND gate Nand. During the second stage, the clock signal received by the first clock signal end CLKIN1 of the shift register unit is of a high level, and the enable signal EN is of a high level. Thus, in the second stage, the signal OUT outputted by the shift register unit as illustrated in FIG. 17 or 18 is of a high level.

Upon entering a third stage from the second stage, the selection signal CHO, i.e. the forward selection signal CHOF is of a low level, so that the fourth transmission gate TG4 is turned on, and the clock signal received by the second backward clock signal end CLKIN2 of the shift register unit is changed from being of a low level to be of a high level. Thus the signal OUT_Latch outputted by the latch circuit is changed from being of a high level to be of a low level, so that the sixth transmission gate TG6 as illustrated in FIG. 17 or 18 is turned off, the third transistor T3 is turned on, and a low level signal VSS is transmitted to an input end of the first NAND gate Nand1. As a result, in the third stage, one input end of the first NAND gate Nand1 receives the low level signal VSS, another input end of the first NAND gate Nand1 receives the enable signal EN which is of a high level in the third stage, so that the signal OUT outputted by the shift register unit as illustrated in FIG. 17 or 18 is of a low level.

After that, the shift register unit as illustrated in FIG. 13 or 18 is kept to be in the third stage, until the forward selection signal CHOF is turned to be of a high level again. Then the shift register unit as illustrated in FIG. 17 or 18 enters the first stage from the third stage. During the first and second stages, the shift register unit as illustrated in FIGS. 17 and 18 is in the operation state, while during the third stage, the shift register unit as illustrated in FIGS. 17 and 18 is in the non-operation state. Since the backward selection signal CHOB does not affect the various circuits in the shift register unit, the backward selection signal CHOB is not illustrated in FIG. 19.

Figure 20:
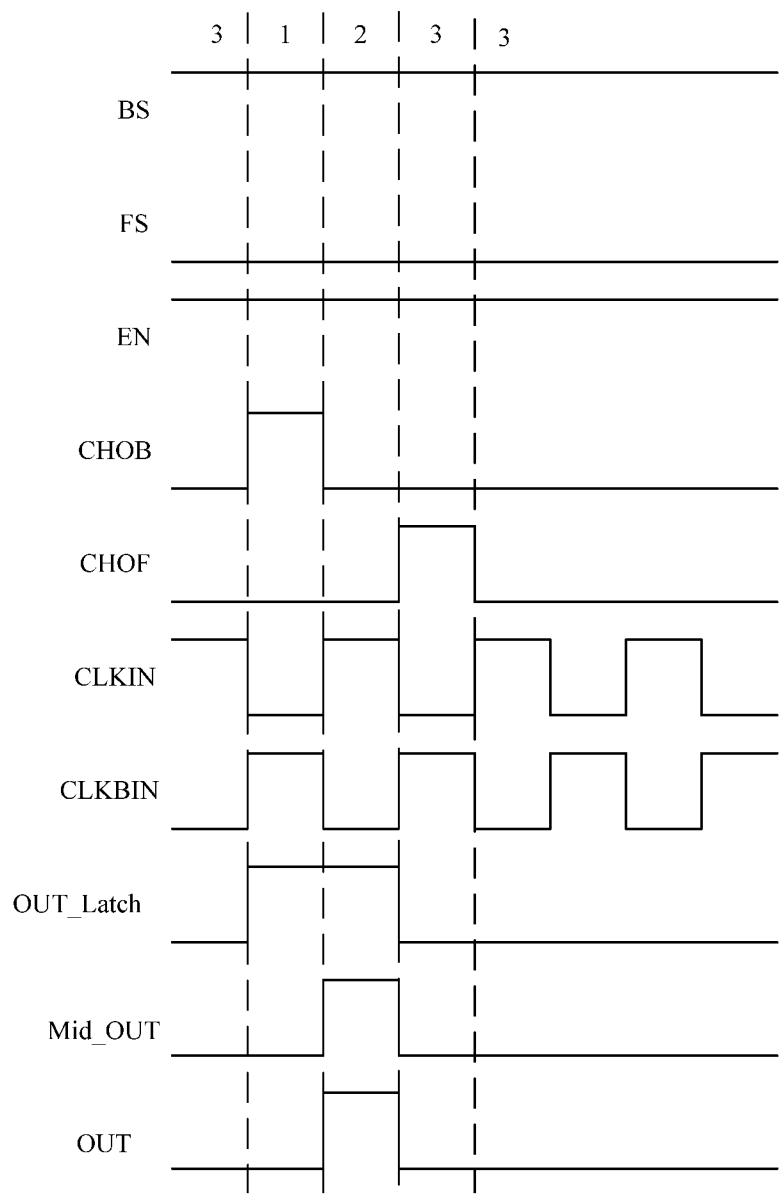
FIG. 20 illustrates a workflow diagram for a backward scanning by the shift register unit as illustrated in FIG. 17 or 18.

When the shift register unit as illustrated in FIGS. 17 and 18 scans backwardly, the backward control signal BS is of a high level, the forward control signal FS is of a low level. Thus, the seventh transmission gate TG7 is turned off, the eighth transmission gate TG8 is turned on, the backward selection signal CHOB is the selection signal CHO, and the workflow of the shift register unit is as illustrated in FIG. 20. When the shift register unit as illustrated in FIG. 17 or 18 scans backwardly, the operations of the latch circuit, the transmission circuit and the buffer circuit are exactly same as the operations of those circuits when the shifter register unit scans forwardly, and thus the descriptions thereof are omitted herein. When scanning backwardly, the backward selection signal CHOF does not affect the various circuits in the shift register unit.

When the shift register unit as illustrated in FIG. 17 or 18 scans, the clock signal received by the second clock signal end CLKIN2 of the shift register unit will be inputted to the input end of the NOR gate when the shift register unit is in the non-operation state, which may also charge and discharge the gate capacitor in the NOR gate. However, it is unnecessary for the shift register unit to adopt a pair of complementary and inverted clock signal to control the turning-on and turning-off of the transmission gate. As a result, in contrast to the power consumption of a traditional shift register unit in the non-operation state, the meaningless power consumption of the shift register unit in the non-operation state according to the embodiment of the present disclosure is still reduced.

Thirteenth and Fourteenth Embodiments Regarding Shift Register Unit

Figure 21:
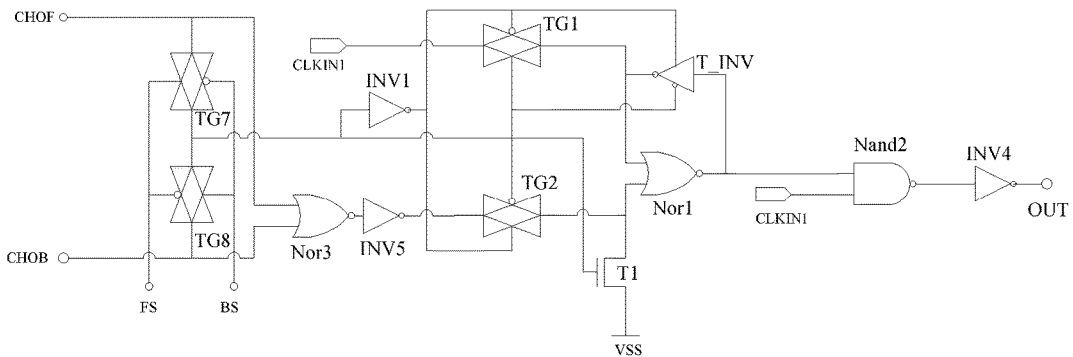
FIG. 21 is a seventh schematic diagram for the structure of the shift register unit according to an embodiment of the present disclosure.

In the thirteenth embodiment of the present disclosure, the shift register unit is as illustrated in FIG. 21, wherein the feedback signal FB is obtained by processing the forward selection signal CHOF and the backward selection signal CHOB by an OR operation, the shift register unit includes the latch circuit, the transmission circuit, the buffer circuit, and the scanning direction selecting circuit. And the latch circuit is as illustrated in FIG. 3, the transmission circuit is as illustrated in FIG. 6, the buffer circuit merely includes one fourth inverter, and the scanning direction selecting circuit is as illustrated in FIG. 8.

Figure 22:
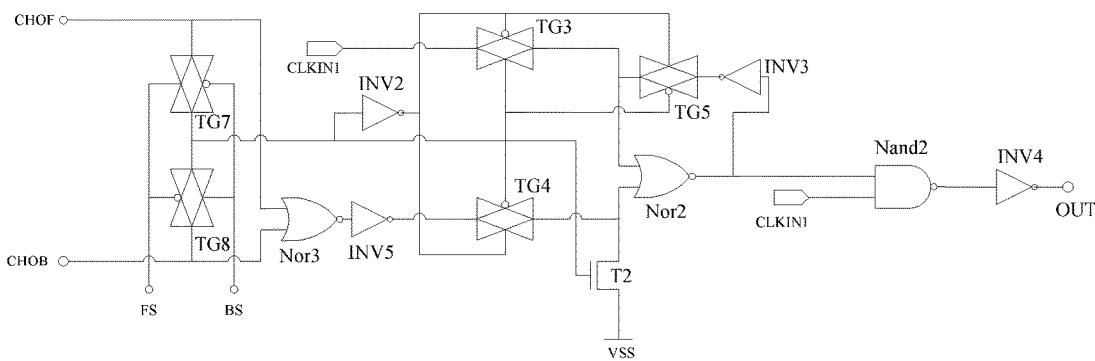
FIG. 22 is an eighth schematic diagram for the structure of the shift register unit according to an embodiment of the present disclosure.

In the fourteenth embodiment of the present disclosure, the shift register unit is as illustrated in FIG. 22, wherein the feedback signal FB is obtained by processing the forward selection signal CHOF and the backward selection signal CHOB by an OR operation, the shift register unit includes the latch circuit, the transmission circuit, the buffer circuit, and the scanning direction selecting circuit. And the latch circuit is as illustrated in FIG. 4, the transmission circuit is as illustrated in FIG. 6, the buffer circuit merely includes one fourth inverter, and the scanning direction selecting circuit is as illustrated in FIG. 8.

When the shift register unit as illustrated in FIGS. 21 and 22 scans forwardly, the forward control signal FS is of a high level, the backward control signal BS is of a low level. Thus, the seventh transmission gate TG7 is turned on, the eighth transmission gate TG8 is turned off, the forward selection signal CHOF is the selection signal CHO, and the workflow of the shift register unit is as illustrated in FIG. 11. In the following, it is assumed that the clock signal received by the first clock signal end CLKIN1 of the shift register unit illustrated in FIG. 21 or 22 is the first clock signal CLK1. Obviously, the clock signal received by the first clock signal end CLKIN1 of the shift register unit illustrated in FIG. 21 or 22 can alternatively be the second clock signal CLK2.

During a first stage, i.e. a time period where the selection signal CHO (i.e. the forward selection signal CHOF) is of a high level, the signal OUT_Latch outputted by the latch circuit is of a high level. Thus, an input end of the second NAND gate Nand2 as illustrated in FIG. 21 or 22 is of a high level. During the first stage, the clock signal received by the first clock signal end CLKIN1 of the shift register unit is of a low level. Thus, in the first stage, the signal OUT outputted by the shift register unit as illustrated in FIG. 21 or 22 is of a low level.

During a second stage, i.e. a time period where the selection signal CHO (i.e. the forward selection signal CHOF) is of a low level, the signal OUT_Latch outputted by the latch circuit is still of a high level. Thus, the input end of the second NAND gate Nand2 as illustrated in FIG. 21 or 22 is of a high level. During the second stage, the clock signal received by the first clock signal end CLKIN1 of the shift register unit is of a high level. Thus, in the second stage, the signal OUT outputted by the shift register unit as illustrated in FIG. 21 or 22 is of a high level.

Upon entering a third stage from the second stage, since the backward selection signal CHOB is turned to be of a high level, the forward selection signal CHOF is still of a low level. Thus, the signal obtained by processing the forward selection signal CHOF and the backward selection signal CHOB by the third NOR gate Nor4 and the fifth inverter INV5 is changed from being of a low level to be of a high level, so that the signal OUT_Latch outputted by the latch circuit is changed from being of a high level to be of a low level. That is, upon entering the third stage from the second stage, since the backward selection signal CHOB is changed from being of a low level to be of a high level, the signal OUT_Latch outputted by the latch circuit is changed from being of a high level to be of a low level; upon entering the third stage from the second stage, the clock signal received by the first clock signal end CLKIN1 of the shift register unit is changed from being of a high level to be of a low level, so that the signal OUT outputted by the shift register unit as illustrated in FIG. 21 or 22 is changed from being of a high level to be of a low level. As a result, the signal OUT outputted by the shift register unit as illustrated in FIG. 21 or 22 is of a low level during the third stage.

After that, the shift register unit as illustrated in FIG. 21 or 22 is kept to be in the third stage, until the forward selection signal CHOF is turned to be of a high level again. Then the shift register unit as illustrated in FIG. 21 or 22 enters the first stage from the third stage. During the first and second stages, the shift register unit as illustrated in FIGS. 21 and 22 is in the operation state, while during the third stage, the shift register unit as illustrated in FIGS. 21 and 22 is in the non-operation state.

When the shift register unit as illustrated in FIGS. 21 and 22 scans backwardly, the backward control signal BS is of a high level, the forward control signal FS is of a low level. Thus, the seventh transmission gate TG7 is turned off, the eighth transmission gate TG8 is turned on, the backward selection signal CHOB is the selection signal CHO, and the workflow of the shift register unit is as illustrated in FIG. 12. When the shift register unit as illustrated in FIG. 21 or 22 scans backwardly, the operations of the latch circuit, the transmission circuit and the buffer circuit are exactly same as the operations of those circuits when the shifter register unit scans forwardly, and thus the descriptions thereof are omitted herein.

When the shift register unit as illustrated in FIG. 21 or 22 scans, the clock signal received by the first clock signal end CLKIN1 of the shift register unit will be inputted to the input end of the NAND gate when the shift register unit is in the non-operation state, which may also charge and discharge the gate capacitor in the NAND gate. However, it is unnecessary for the shift register unit to adopt a pair of complementary and inverted clock signal to control the turning-on and turning-off of the transmission gate. As a result, in contrast to the power consumption of a traditional shift register unit in the non-operation state, the meaningless power consumption of the shift register unit in the non-operation state according to the embodiment of the present disclosure is still reduced.

Fifteenth and Sixteenth Embodiments Regarding Shift Register Unit

Figure 23:
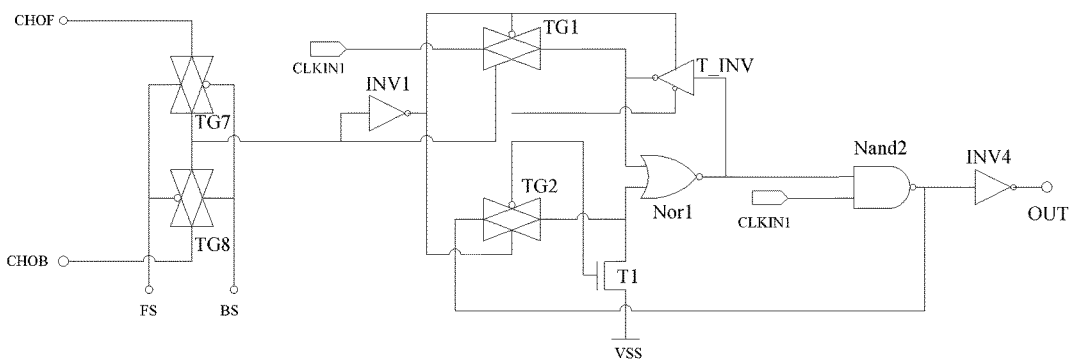
FIG. 23 is a ninth schematic diagram for the structure of the shift register unit according to an embodiment of the present disclosure.

In the fifteenth embodiment of the present disclosure, the shift register unit is as illustrated in FIG. 23, wherein the feedback signal FB is the signal OUT_Trans outputted by the transmission circuit, the shift register unit includes the latch circuit, the transmission circuit, the buffer circuit, and the scanning direction selecting circuit. And the latch circuit is as illustrated in FIG. 3, the transmission circuit is as illustrated in FIG. 6, the buffer circuit merely includes one fourth inverter, and the scanning direction selecting circuit is as illustrated in FIG. 8.

Figure 24:
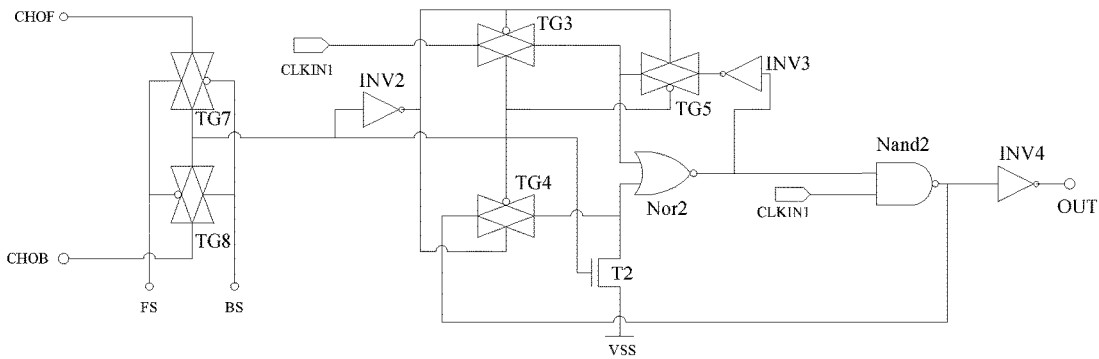
FIG. 24 is a tenth schematic diagram for the structure of the shift register unit according to an embodiment of the present disclosure.

In the sixteenth embodiment of the present disclosure, the shift register unit is as illustrated in FIG. 24, wherein the feedback signal FB is the signal OUT_Trans outputted by the transmission circuit, the shift register unit includes the latch circuit, the transmission circuit, the buffer circuit, and the scanning direction selecting circuit. And the latch circuit is as illustrated in FIG. 4, the transmission circuit is as illustrated in FIG. 6, the buffer circuit merely includes one fourth inverter, and the scanning direction selecting circuit is as illustrated in FIG. 8.

When the shift register unit as illustrated in FIGS. 23 and 24 scans forwardly, the forward control signal FS is of a high level, the backward control signal BS is of a low level. Thus, the seventh transmission gate TG7 is turned on, the eighth transmission gate TG8 is turned off, the forward selection signal CHOF is the selection signal CHO, and the workflow of the shift register unit is as illustrated in FIG. 15. In the following, it is assumed that the clock signal received by the first clock signal end CLKIN1 of the shift register unit as illustrated in FIG. 23 or 24 is the first clock signal CLK1. Obviously, the clock signal received by the first clock signal end CLKIN1 of the shift register unit as illustrated in FIG. 23 or 24 can alternatively be the second clock signal CLK2.

During a first stage, i.e. a time period where the selection signal CHO (i.e. the forward selection signal CHOF) is of a high level, the signal OUT_Latch outputted by the latch circuit is of a high level. Thus, an input end of the second NAND gate Nand2 as illustrated in FIG. 23 or 24 is of a high level. During the first stage, the clock signal received by the first clock signal end CLKIN1 of the shift register unit is of a low level. Thus, in the first stage, the signal OUT outputted by the shift register unit as illustrated in FIG. 23 or 24 is of a low level.

During a second stage, i.e. a time period where the selection signal CHO (i.e. the forward selection signal CHOF) is of a low level, the signal OUT_Latch outputted by the latch circuit is still of a high level. Thus, an input end of the second NAND gate Nand2 as illustrated in FIG. 23 or 24 is of a high level. During the second stage, the clock signal received by the first clock signal end CLKIN1 of the shift register unit is of a high level. Thus, in the second stage, the signal OUT outputted by the shift register unit as illustrated in FIG. 23 or 24 is of a high level.

Upon entering a third stage from the second stage, since the clock signal received by the first clock signal end CLKIN1 of the shift register unit is turned to be of a low level from being the high level, the latch circuit is still kept to be in the same state as the state during the second stage, i.e. the latch circuit still outputs a high level signal. Thus, the signal OUT outputted by the shift register unit as illustrated in FIG. 23 or 24 is changed from being of a high level to be of a low level, i.e. the signal OUT_Trans outputted by the transmission circuit (i.e. the signal outputted by the second NAND gate Nand2) is changed from being of a low level to be of a high level. That is, the feedback signal FB is changed from being of a low level to be of a high level, so that the signal OUT_Latch outputted by the latch circuit is changed from being of a high level to be of a low level. That is, upon entering the third stage from the second stage, since the clock signal received by the first clock signal end CLKIN1 of the shift register unit is changed from being of a high level to be of a low level, the signal OUT_Latch outputted by the latch circuit is changed from being of a high level to be of a low level, so that the signal OUT outputted by the shift register unit as illustrated in FIG. 23 or FIG. 24 is changed from being of a high level to be of a low level. As a result, the signal OUT outputted by the shift register unit as illustrated in FIG. 23 or 24 is of a low level during the third stage.

After that, the shift register unit as illustrated in FIG. 23 or 24 is kept to be in the third stage, until the forward selection signal CHOF is turned to be of a high level again. Then the shift register unit as illustrated in FIG. 23 or 24 enters the first stage from the third stage. During the first and second stages, the shift register unit as illustrated in FIGS. 23 and 24 is in the operation state, while during the third stage the shift register unit as illustrated in FIGS. 23 and 24 is in the non-operation state.

When the shift register unit as illustrated in FIGS. 23 and 24 scans backwardly, the backward control signal BS is of a high level, and the forward control signal FS is of a low level. Thus, the seventh transmission gate TG7 is turned off, the eighth transmission gate TG8 is turned on, the backward selection signal CHOB is the selection signal CHO, and the workflow of the shift register unit is as illustrated in FIG. 16. When the shift register unit as illustrated in FIG. 23 or 24 scans backwardly, the operations of the latch circuit, the transmission circuit and the buffer circuit are exactly same as the operations of those circuits when the shifter register unit scans forwardly, and thus the descriptions thereof are omitted herein.

When the shift register unit as illustrated in FIG. 23 or 24 scans, the clock signal received by the first clock signal end CLKIN1 of the shift register unit will be inputted to the input end of the NAND gate when the shift register unit is in the non-operation state, which may also charge and discharge the gate capacitor in the NAND gate. However, it is unnecessary for the shift register unit to adopt a pair of complementary and inverted clock signal to control the turning-on and turning-off of the transmission gate. As a result, in contrast to the power consumption of a traditional shift register unit in the non-operation state, the meaningless power consumption of the shift register unit in the non-operation state according to the embodiment of the present disclosure is still reduced. However, there is a risk of logic competition in the shift register unit as illustrated in FIG. 23 or 24 when a duty ratio of the clock signal is less than 50%.

Seventeenth and Eighteenth Embodiments Regarding Shift Register Unit

Figure 25:
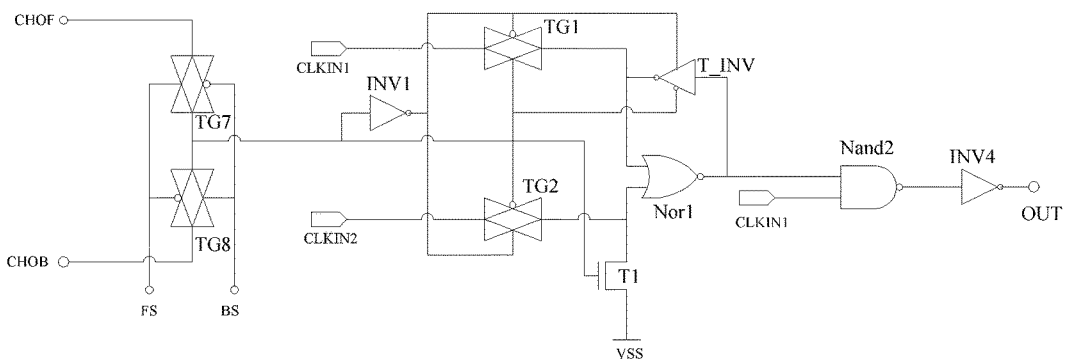
FIG. 25 is a eleventh schematic diagram for the structure of the shift register unit according to an embodiment of the present disclosure.

In the seventeenth embodiment of the present disclosure, the shift register unit is as illustrated in FIG. 25, wherein the feedback signal FB is the clock signal received by the second clock signal end CLKIN2 of the shift register unit, the shift register unit includes the latch circuit, the transmission circuit, the buffer circuit, and the scanning direction selecting circuit. And the latch circuit is as illustrated in FIG. 3, the transmission circuit is as illustrated in FIG. 6, the buffer circuit merely includes one fourth inverter, and the scanning direction selecting circuit is as illustrated in FIG. 8.

Figure 26:
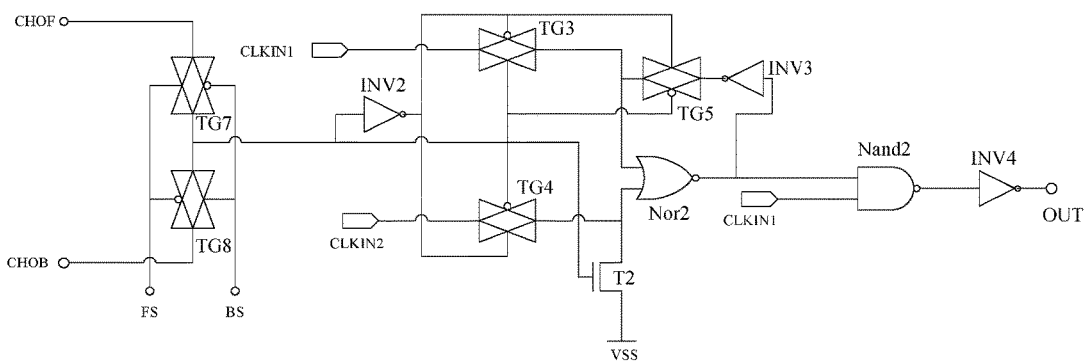
FIG. 26 is a twelfth schematic diagram for the structure of the shift register unit according to an embodiment of the present disclosure.

In the eighteenth embodiment of the present disclosure, the shift register unit is as illustrated in FIG. 26, wherein the feedback signal FB is the clock signal received by the second clock signal end CLKIN2 of the shift register unit, the shift register unit includes the latch circuit, the transmission circuit, the buffer circuit, and the scanning direction selecting circuit. And the latch circuit is as illustrated in FIG. 4, the transmission circuit is as illustrated in FIG. 6, the buffer circuit merely includes one fourth inverter, and the scanning direction selecting circuit is as illustrated in FIG. 8.

When the shift register unit as illustrated in FIGS. 25 and 26 scans forwardly, the forward control signal FS is of a high level, the backward control signal BS is of a low level. Thus, the seventh transmission gate TG7 is turned on, the eighth transmission gate TG8 is turned off, the forward selection signal CHOF is the selection signal CHO, and the workflow of the shift register unit is as illustrated in FIG. 19.

During a first stage, i.e. a time period where the selection signal CHO (i.e. the forward selection signal CHOF) is of a high level, the signal OUT_Latch outputted by the latch circuit is of a high level. Thus, an input end of the second NAND gate Nand2 as illustrated in FIG. 25 or 26 is of a high level. During the first stage, the clock signal received by the first clock signal end CLKIN1 of the shift register unit is of a low level. Thus, in the first stage the signal OUT outputted by the shift register unit as illustrated in FIG. 25 or 26 is of a low level.

During a second stage, i.e. a time period where the selection signal CHO (i.e. the forward selection signal CHOF) is of a low level, the signal OUT_Latch outputted by the latch circuit is still of a high level. Thus, an input end of the second NAND gate Nand2 as illustrated in FIG. 25 or 26 is of a high level. During the second stage, the clock signal received by the first clock signal end CLKIN1 of the shift register unit is of a high level. Thus, in the second stage, the signal OUT outputted by the shift register unit as illustrated in FIG. 25 or 26 is of a high level.

Upon entering a third stage from the second stage, the selection signal CHO, i.e. the forward selection signal CHOF is of a low level, so that the fourth transmission gate TG4 is turned on, and the clock signal received by the second clock signal end CLKIN2 of the shift register unit is changed from being of a low level to be of a high level. Thus the signal OUT_Latch outputted by the latch circuit is changed from being of a high level to be of a low level, so that an input end of the second NAND gate Nand2 as illustrated in FIG. 25 or 26 receives a low level signal. During the third stage, the clock signal received by the first clock signal end CLKIN1 of the shift register unit is of a low level. Thus, in the third stage, the signal OUT outputted by the shift register unit as illustrated in FIG. 25 or 26 is of a low level.

When the shift register unit as illustrated in FIGS. 25 and 26 scans backwardly, the backward control signal BS is of a high level, and the forward control signal FS is of a low level. Thus, the seventh transmission gate TG7 is turned off, the eighth transmission gate TG8 is turned on, the backward selection signal CHOB is the selection signal CHO, and the workflow of the shift register unit is as illustrated in FIG. 20. When the shift register unit as illustrated in FIG. 25 or 26 scans backwardly, the operations of the latch circuit, the transmission circuit and the buffer circuit are exactly same as the operations of those circuits when the shifter register unit scans forwardly, and thus the descriptions thereof are omitted herein.

When the shift register unit as illustrated in FIG. 25 or 26 scans, the clock signal received by the second clock signal end CLKIN2 of the shift register unit will be inputted to the input end of the NOR gate when the shift register unit is in the non-operation state, which may charge and discharge the gate capacitor in the NOR gate. The clock signal received by the first clock signal end CLKIN1 of the shift register unit will also be inputted to the input end of the NAND gate when the shift register unit is in the non-operation state, which may also charge and discharge the gate capacitor in the NAND gate. However, it is unnecessary for the shift register unit to adopt a pair of complementary and inverted clock signal to control the turning-on and turning-off of the transmission gate. As a result, in contrast to the power consumption of a traditional shift register unit in the non-operation state, the meaningless power consumption of the shift register unit in the non-operation state according to the embodiment of the present disclosure is still reduced.

Nineteenth and Twentieth Embodiments Regarding Display Panel

In the nineteenth and twentieth embodiments of the present disclosure, it is provided a display panel including a plurality of stages of the shift register units according to the embodiment of the present disclosure.

Figure 27:
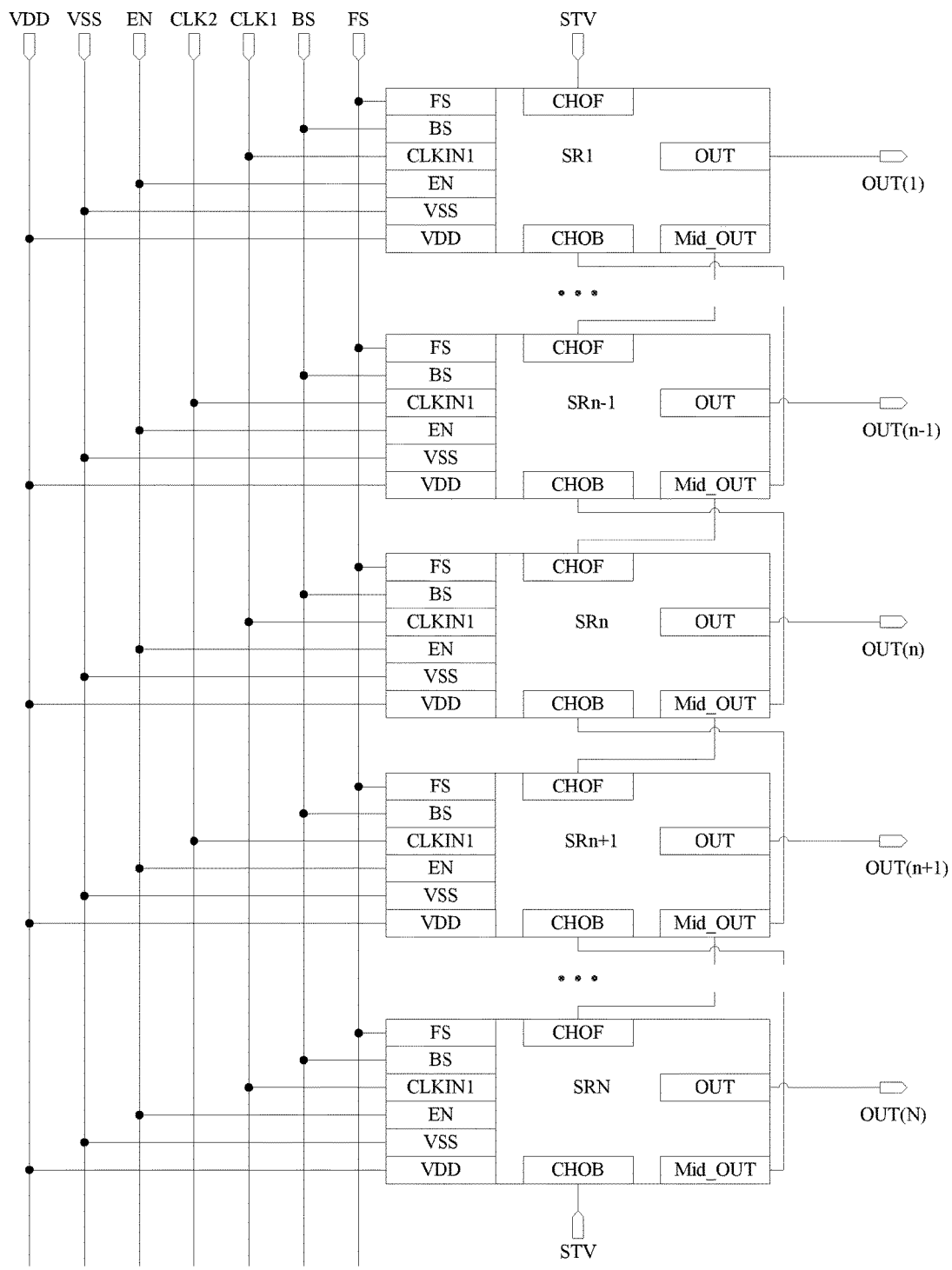
FIG. 27 is a first schematic diagram for a cascading connection of the shift register units as illustrated in any one of FIGS. 9, 10, 13 and 14.
Figure 28:
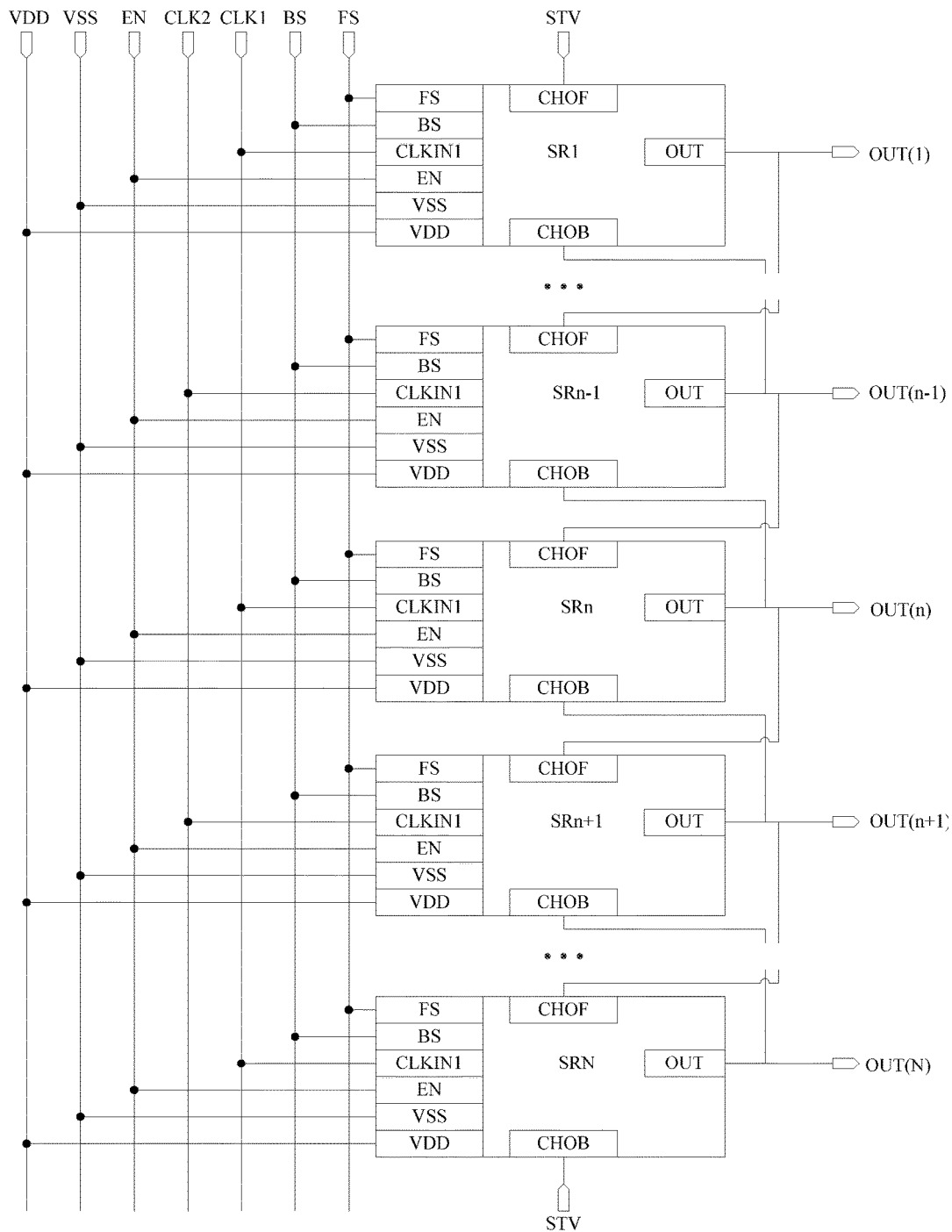
FIG. 28 is a second schematic diagram for a cascading connection of the shift register units as illustrated in any one of FIGS. 9, 10, 13 and 14.

When the shift register units in the display panel are as illustrated in FIG. 9, 10, 13 or 14, the connection of each stage of shift register units is as illustrated in FIG. 27 or FIG. 28.

In the connections as illustrated in FIG. 27, a forward selection signal CHOF received by an m-th stage shift register unit SRm except a first stage shift register unit SR1 is a signal Mid_OUT of an input end of a first NAND gate Nand1 in a transmission circuit in an (m−1)-th stage shift register unit SRm−1, wherein m is not less than 2 and not greater than N. A forward selection signal CHOF received by the first stage shift register unit SR1 is an initial trigger signal STV. In the connections as illustrated in FIG. 27, a backward selection signal CHOB received by a k-th stage shift register unit SRk except an N-th stage shift register unit SRN is a signal Mid_OUT of an input end of a first NAND gate Nand1 in a transmission circuit in a (k+1)-th stage shift register unit SRk+1, wherein k is not less than 1 and not greater than N−1. A backward selection signal CHOB received by the N-th stage shift register unit SRN is also the initial trigger signal STV. As illustrated in FIG. 27, when p is an odd number, a clock signal received by a first clock signal end CLKIN1 of a p-th stage shift register unit SRp is the first clock signal CLK1. When p is an even number, a clock signal received by a first clock signal end CLKIN1 of the p-th stage shift register unit SRp is the second clock signal CLK2, wherein p is not less than 1 and not greater than N. As illustrated in FIG. 27, a power signal VDD received by each of the shift register units is provided for powering active devices in the shift register unit.

In the connections as illustrated in FIG. 28, the forward selection signal CHOF received by the m-th stage shift register unit SRm except the first stage of shift register unit SR1 is a signal OUT(m−1) outputted by the (m−1)-th stage of shift register unit SRm−1, wherein m is not less than 2 and not greater than N. The forward selection signal CHOF received by the first stage of shift register unit SR1 is the initial trigger signal STV. In the connections as illustrated in FIG. 28, the backward selection signal CHOB received by the k-th stage shift register unit SRk except the N-th stage shift register unit SRN is a signal OUT(+1) outputted by the (k+1)-th stage shift register unit SRk+1, wherein k is not less than 1 and not greater than N−1. The backward selection signal CHOB received by the N-th stage of shift register unit SR1 is also the initial trigger signal STV. As illustrated in FIG. 28, when p is an odd number, the clock signal received by the first clock signal end CLKIN1 of the p-th stage shift register unit SRp is the first clock signal CLK1. When p is an even number, the clock signal received by the first clock signal end CLKIN1 of the p-th stage shift register unit SRp is the second clock signal CLK2, wherein p is not less than 1 and not greater than N. As illustrated in FIG. 28, the power signal VDD received by the shift register units is provided for powering active devices in the shift register unit.

Twenty First and Twenty Second Embodiments Regarding Display Panel

Figure 29:
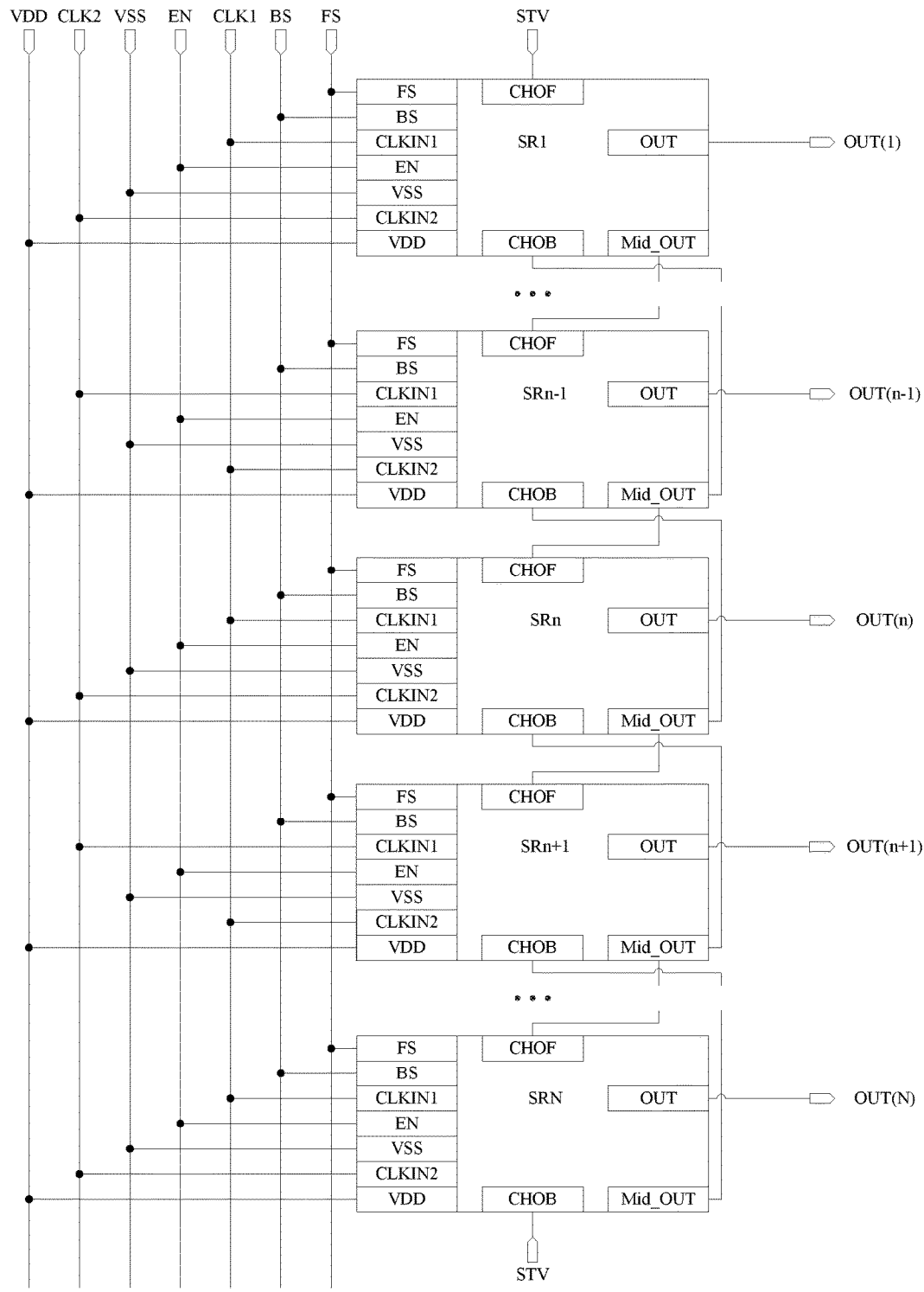
FIG. 29 is a first schematic diagram for s cascading connection of the shift register units as illustrated in FIG. 17 or 18.
Figure 30:
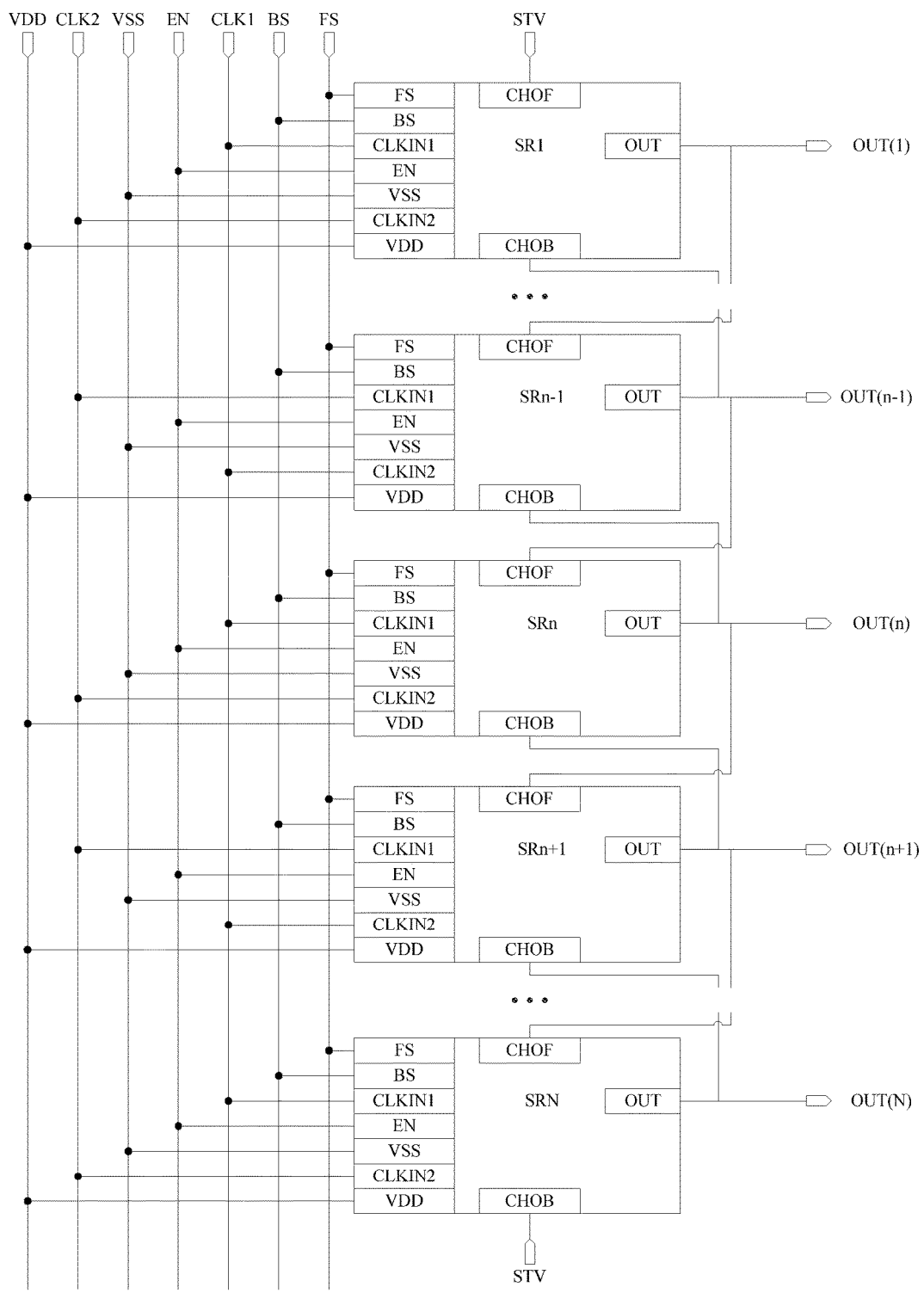
FIG. 30 is a second schematic diagram for a cascading connection of the shift register units as illustrated in FIG. 17 or 18.

When the shift register units in the display panel are as illustrated in FIG. 17 or 18, the connection of each stage of shift register units is as illustrated in FIG. 29 or 30. The difference between the connection of each stage of shift register unit as illustrated in FIG. 29 and the connection of each stage of shift register unit as illustrated in FIG. 27 is merely in that: the each stage of shift register unit as illustrated in FIG. 29 further includes a second clock signal end CLKIN2. As illustrated in FIG. 29, when p is an odd number, the clock signal received by the second clock signal end CLKIN2 of the p-th stage shift register unit SRp is the second clock signal CLK2. When p is an even number, the clock signal received by the second clock signal end CLKIN2 of the p-th stage shift register unit SRp is the first clock signal CLK1, wherein p is not less than 1 and not greater than N. The difference between the connection of each stage of shift register unit as illustrated in FIG. 30 and the connection of each stage of shift register unit as illustrated in FIG. 28 is merely in that: the each stage of shift register unit as illustrated in FIG. 30 further includes the second clock signal end CLKIN2. As illustrated in FIG. 30, when p is an odd number, the clock signal received by the second clock signal end CLKIN2 of the p-th stage shift register unit SRp is the second clock signal CLK2. When p is an even number, the clock signal received by the second clock signal end CLKIN2 of the p-th stage shift register unit SRp is the first clock signal CLK1, wherein p is not less than 1 and not greater than N.

Twenty Third and Twenty Fourth Embodiments Regarding Display Panel

Figure 31:
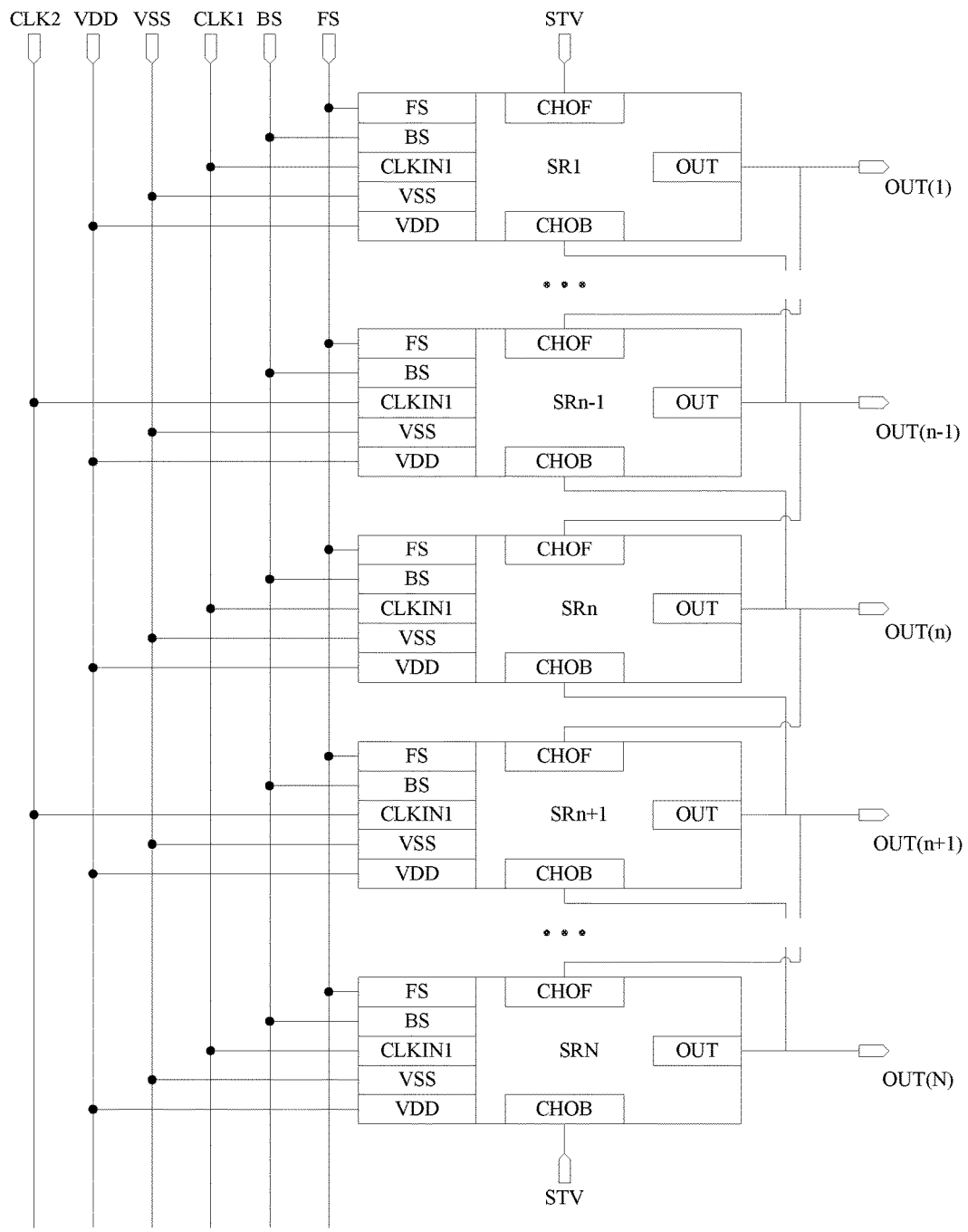
FIG. 31 is a schematic diagram for a cascading connection of the shift register units as illustrated in any one of FIGS. 21, 22, 23 and 24.

When the shift register units in the display panel are as illustrated in FIG. 21, 22, 23 or 24, the connection of each stage of shift register units is as illustrated in FIG. 31. The difference between the connection of each stage of shift register units as illustrated in FIG. 31 and the connection of each stage of shift register units as illustrated in FIG. 28 is merely in that: it is necessary for each stage of the shift register units as illustrated in FIG. 28 to receive the enable signal EN, while it is unnecessary for each stage of the shift register units as illustrated in FIG. 31 to receive the enable signal EN.

Figure 32:
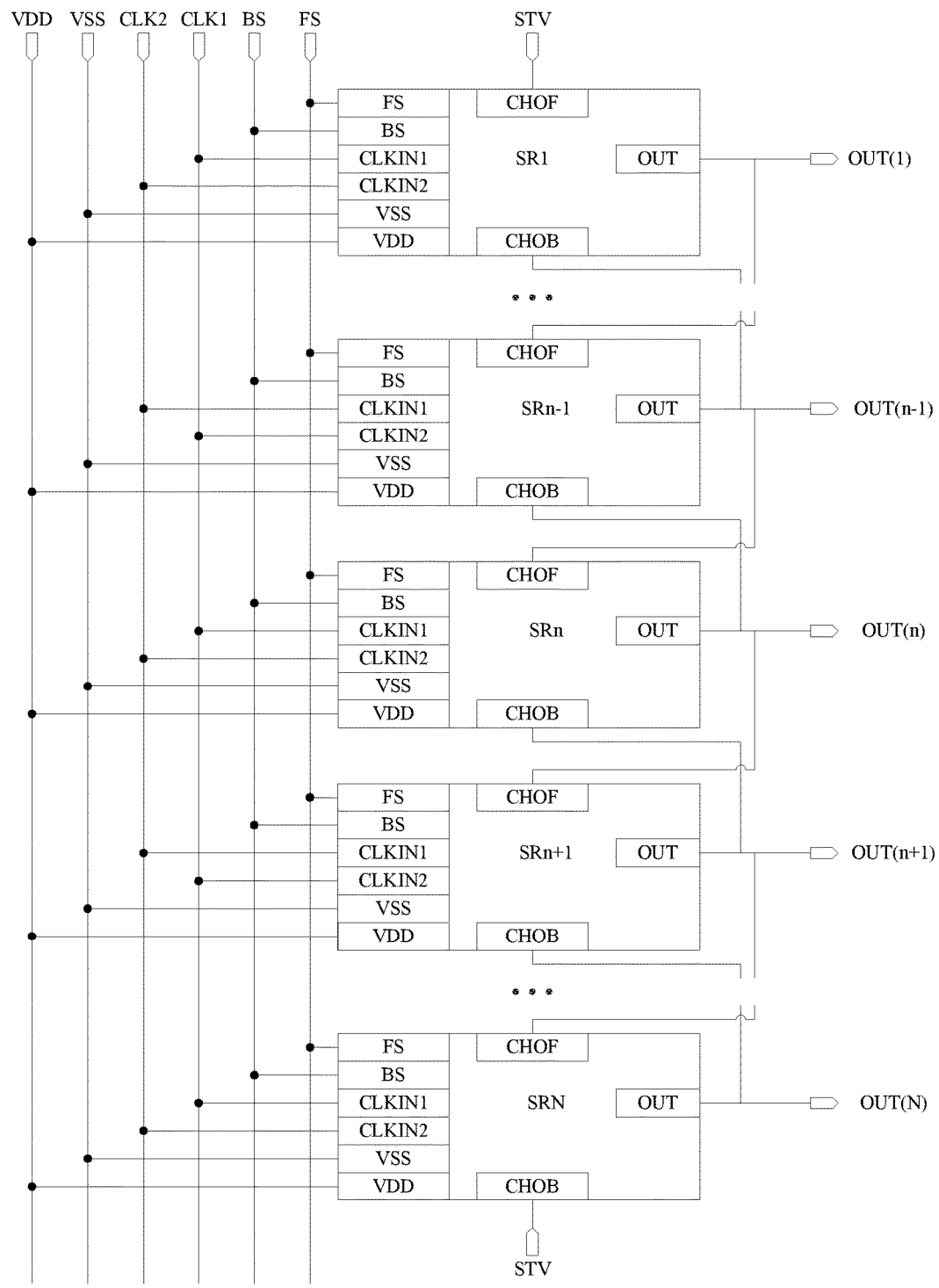
FIG. 32 is a schematic diagram for a cascading connection of the shift register units as illustrated in FIG. 25 or 26.

When the shift register units in the display panel are as illustrated in FIG. 25 or 26, the connection of each stage of shift register units is as illustrated in FIG. 32. The difference between the connection of each stage of shift register units as illustrated in FIG. 32 and the connection of each stage of shift register units as illustrated in FIG. 29 is merely in that: it is necessary for each stage of the shift register units as illustrated in FIG. 29 to receive the enable signal EN, while it is unnecessary for each stage of the shift register units as illustrated in FIG. 32 to receive the enable signal EN.

Twenty Fifth Embodiment Regarding Display Apparatus

In the embodiment of the present disclosure, it is further provided a display apparatus including the display panel according to the embodiment of the present disclosure.

A person skilled in the art may understand that the figures are used for illustration purpose only, the modules and the flows illustrated in the figures may not be necessarily required to implement the present disclosure.

A person skilled in the art may understand that the modules in the apparatus according to the embodiments of the present disclosure may be allocated in the apparatus based on the description of the embodiments, or may be changed accordingly to be allocated in one or more apparatus being different from the apparatus of the embodiments of the present disclosure. The modules in the above embodiments may be merged into one module, or may be further divided into a plurality of sub-modules.

The sequence numbers of the embodiments in the present disclosure are merely for facilitating the description, and do not indicate priorities of the embodiments.

It is appreciated that a person skilled in the art may modify and improve the present disclosure without departing from the spirit and principle of the present disclosure. As a result, if those modification and improvement falls within the scope of claims and the equivalence thereof, those modification and improvement fall within the scope of the present disclosure.

What is claimed is:

1. A shift register unit, comprising:
   a latch circuit, configured to
      process a clock signal received by a first clock signal end of the shift register unit and a low level signal by a NOR operation to obtain a signal, and output the obtained signal, during a time period where a selection signal is of a high level, wherein the clock signal received by the first clock signal end is of a low level when the selection signal is of a high level;
      process the signal outputted by the latch circuit when the selection signal is of a high level by a NOT operation, then process the resultant signal with a feedback signal by a NOR operation to obtain a signal, and output the obtained signal, during a first time period where the selection signal is of a low level; and
      output a low level signal, during a time period where the selection signal is of a low level other than the first time period where the selection signal is of a first low level; and
   a transmission circuit, configured to
      output a signal related to the clock signal received by the first clock signal end when the signal outputted by the latch circuit is of a high level; and
      output a corresponding signal when the signal outputted by the latch circuit is of a low level;
   wherein, the feedback signal is able to make the signal outputted by the latch circuit during the time period where the selection signal is of a high level and the signal outputted by the latch circuit during the first time period where the selection signal is of a low level be the same;
   the feedback signal is converted from being of a low level to being of a high level, at an end time point of the first time period where the selection signal is of a low level; and the first time period where the selection signal is of a low level is a time period from a time point when the selection signal is converted from being of a low level to being of a high level to a time point when a signal outputted by a next stage shift register unit with respect to the shift register unit jumps from being of a low level to being of a high level.

2. The shift register unit according to claim 1, wherein the latch circuit comprises a first inverter, a ternary inverter, a first transmission gate, a second transmission gate, a first NOR gate and a first transistor;

the first inverter receives the selection signal, processes the selection signal by a NOT operation to obtain a signal and outputs the obtained signal;

a control end of the first transmission gate which is effective when inputted with a low level receives the signal outputted by the first inverter, another control end of the first transmission gate which is effective when inputted with a high level receives the selection signal, an input end of the first transmission gate is the first clock signal end of the shift register unit, and the first transmission gate outputs the clock signal received by its input end when the first transmission gate is turned on;

a control end of the second transmission gate which is effective when inputted with a low level receives the selection signal, another control end of the second transmission gate which is effective when inputted with a high level receives the signal outputted by the first inverter, and the second transmission gate receives the feedback signal, and outputs the feedback signal when the second transmission gate is turned on;

an input end of the first NOR gate is connected to an output end of the first transmission gate and an output end of the ternary inverter, respectively, another input end of the first NOR gate is connected to an output end of the second transmission gate and a first electrode of the first transistor, and a signal outputted by the first NOR gate is the signal outputted by the latch circuit;

a control end of the ternary inverter which is effective when inputted with a low level receives the selection signal, another control end of the ternary inverter which is effective when inputted with a high level receives the signal outputted by the first inverter, and the ternary inverter receives the signal outputted by the first NOR gate, and processes the signal outputted by the first NOR gate by a NOT operation to obtain a signal and outputs the obtained signal when the selection signal is of a low level and the signal outputted by the first inverter is of a high level; and a gate electrode of the first transistor receives the selection signal, and a second electrode of the first transistor receives a low level signal.

3. The shift register unit according to claim 2, wherein the transmission circuit comprises a sixth transmission gate, a third transistor and a first NAND gate;

a control end of the sixth transmission gate which is effective when inputted with a high level receives the signal outputted by the latch circuit, another control end of the sixth transmission gate which is effective when inputted with a low level receives a signal obtained by processing the signal outputted by the latch circuit by a NOT operation, an input end of the sixth transmission gate is connected to the first clock signal end of the shift register unit, and the sixth transmission gate outputs the signal received by its input end when the signal outputted by the latch circuit is of a high level;

an input end of the first NAND gate receives an enable signal, another input end of the first NAND gate is connected to an output end of the sixth transmission gate and a first electrode of the third transistor respectively, and a signal outputted by the first NAND gate is a signal outputted by the transmission circuit; wherein the enable signal is of a high level during a time period of one frame for displaying an image; and a gate electrode of the third transistor receives the signal obtained by processing the signal outputted by the latch circuit by a NOT operation, and a second electrode of the third transistor receives a low level signal.

4. The shift register unit according to claim 2, wherein the transmission circuit comprises a second NAND gate;

an input end of the second NAND gate receives the signal outputted by the latch circuit, another input end of the second NAND gate is connected to the first clock signal end of the shift register unit, and a signal outputted by the second NAND gate is the signal outputted by the transmission circuit.

5. The shift register unit according to claim 2, further comprising a buffer circuit;

the buffer circuit receives the signal outputted by the transmission circuit, and processes the signal outputted by the transmission circuit by a NOT operation to obtain a signal and output the obtained signal.

6. The shift register unit according to claim 1, wherein the latch circuit comprises a second inverter, a third inverter, a third transmission gate, a fourth transmission gate, a fifth transmission gate, a second NOR gate and a second transistor;

the second inverter receives the selection signal, processes the selection signal by a NOT operation to obtain a signal and outputs the obtained signal;

a control end of the third transmission gate which is effective when inputted with a low level receives the signal outputted by the second inverter, another control end of the third transmission gate which is effective when inputted with a high level receives the selection signal, an input end of the third transmission gate is the first clock signal end of the shift register unit, and the third transmission gate outputs the signal received by its input end when the third transmission gate is turned on;

a control end of the fourth transmission gate which is effective when inputted with a low level receives the selection signal, another control end of the fourth transmission gate which is effective when inputted with a high level receives the signal outputted by the second inverter, and the fourth transmission gate receives the feedback signal, and outputs the feedback signal when the fourth transmission gate is turned on;

an input end of the second NOR gate is connected to an output end of the third transmission gate and an output end of the fifth transmission gate respectively, another input end of the second NOR gate is connected to an output end of the fourth transmission gate and a first electrode of the second transistor, and a signal outputted by the second NOR gate is the signal outputted by the latch circuit;

the third inverter receives the signal outputted by the second NOR gate, processes the signal outputted by the second NOR gate by a NOT operation to obtain a signal and outputs the obtained signal;

a control end of the fifth transmission gate which is effective when inputted with a low level receives the selection signal, another control end of the fifth transmission gate which is effective when inputted with a high level receives the signal outputted by the second inverter, and the fifth transmission gate receives the signal outputted by the third inverter, and outputs the signal outputted by the third inverter when the selection signal is of a low level; and a gate electrode of the second transistor receives the selection signal, and a second electrode of the second transistor receives a low level signal.

7. The shift register unit according to claim 6, wherein the transmission circuit comprises a sixth transmission gate, a third transistor and a first NAND gate;

a control end of the sixth transmission gate which is effective when inputted with a high level receives the signal outputted by the latch circuit, another control end of the sixth transmission gate which is effective when inputted with a low level receives a signal obtained by processing the signal outputted by the latch circuit by a NOT operation, an input end of the sixth transmission gate is connected to the first clock signal end of the shift register unit, and the sixth transmission gate outputs the signal received by its input end when the signal outputted by the latch circuit is of a high level;

an input end of the first NAND gate receives an enable signal, another input end of the first NAND gate is connected to an output end of the sixth transmission gate and a first electrode of the third transistor respectively, and a signal outputted by the first NAND gate is a signal outputted by the transmission circuit; wherein the enable signal is of a high level during a time period of one frame for displaying an image; and a gate electrode of the third transistor receives the signal obtained by processing the signal outputted by the latch circuit by a NOT operation, and a second electrode of the third transistor receives a low level signal.

8. The shift register unit according to claim 6, wherein the transmission circuit comprises a second NAND gate;

an input end of the second NAND gate receives the signal outputted by the latch circuit, another input end of the second NAND gate is connected to the first clock signal end of the shift register unit, and a signal outputted by the second NAND gate is the signal outputted by the transmission circuit.

9. The shift register unit according to claim 6, further comprising a buffer circuit;

the buffer circuit receives the signal outputted by the transmission circuit, and processes the signal outputted by the transmission circuit by a NOT operation to obtain a signal and output the obtained signal.

10. The shift register unit according to claim 1, wherein the transmission circuit comprises a sixth transmission gate, a third transistor and a first NAND gate;

a control end of the sixth transmission gate which is effective when inputted with a high level receives the signal outputted by the latch circuit, another control end of the sixth transmission gate which is effective when inputted with a low level receives a signal obtained by processing the signal outputted by the latch circuit by a NOT operation, an input end of the sixth transmission gate is connected to the first clock signal end of the shift register unit, and the sixth transmission gate outputs the signal received by its input end when the signal outputted by the latch circuit is of a high level;

an input end of the first NAND gate receives an enable signal, another input end of the first NAND gate is connected to an output end of the sixth transmission gate and a first electrode of the third transistor respectively, and a signal outputted by the first NAND gate is a signal outputted by the transmission circuit; wherein the enable signal is of a high level during a time period of one frame for displaying an image; and a gate electrode of the third transistor receives the signal obtained by processing the signal outputted by the latch circuit by a NOT operation, and a second electrode of the third transistor receives a low level signal.

11. The shift register unit according to claim 1, wherein the transmission circuit comprises a second NAND gate;

an input end of the second NAND gate receives the signal outputted by the latch circuit, another input end of the second NAND gate is connected to the first clock signal end of the shift register unit, and a signal outputted by the second NAND gate is the signal outputted by the transmission circuit.

12. The shift register unit according to claim 1, further comprising a buffer circuit;

the buffer circuit receives the signal outputted by the transmission circuit, and processes the signal outputted by the transmission circuit by a NOT operation to obtain a signal and output the obtained signal.

13. The shift register unit according to claim 12, wherein the buffer circuit comprises an odd number of fourth inverters;

the odd number of fourth inverters are connected in series, wherein an input end of a first one of the fourth inverters connected in series receives the signal outputted by the transmission circuit, and the odd number of fourth inverters connected in series process the signal outputted by the transmission circuit by NOT operations and output the signal.

14. The shift register unit according to claim 1, further comprising a scanning direction selecting circuit, configured to output a forward selection signal as the selection signal when a forward control signal is of a high level and a backward control signal is of a low level, and output a backward selection signal as the selection signal when the forward control signal is of a low level and the backward control signal is of a high level.

15. The shift register unit according to claim 14, wherein the scanning direction selecting circuit comprises a seventh transmission gate and an eighth transmission gate;

a control end of the seventh transmission gate which is effective when inputted with a high level receives the forward control signal, another control end of the seventh transmission gate which is effective when inputted with a low level receives the backward control signal, the seventh transmission gate receives the forward selection signal, and outputs the forward selection signal when the forward control signal is of a high level and the backward control signal is of a low level; and a control end of the eighth transmission gate which is effective when inputted with a high level receives the backward control signal, another control end of the eighth transmission gate which is effective when inputted with a low level receives the forward control signal, the eighth transmission gate receives the backward selection signal, and outputs the backward selection signal when the forward control signal is of a low level and the backward control signal is of a high level.

16. The shift register unit according to claim 14, wherein the feedback signal is obtained by processing the forward selection signal and the backward selection signal by an OR operation, the forward selection signal is the selection signal during a forward scanning, and the backward selection signal is the selection signal during a backward scanning.

17. The shift register unit according to claim 1, wherein the feedback signal is a clock signal received by a second clock signal end of the shift register unit;

when the clock signal received by the first clock signal end of the shift register unit is of a high level, the clock signal received by the second clock signal end of the shift register unit is of a low level; and when the clock signal received by the second clock signal end of the shift register unit is of a high level, the clock signal received by the first clock signal end of the shift register unit is of a low level.

18. The shift register unit according to claim 1, wherein the feedback signal is the signal outputted by the transmission circuit.

19. A display panel comprising a plurality of stages of the shift register units according to claim 1.

20. A display apparatus comprising the display panel according to claim 19.

* * * * *